US012777660B2

(12) United States Patent
Akamine et al.

(10) Patent No.: US 12,777,660 B2
(45) Date of Patent: Oct. 27, 2026

(54) SEMICONDUCTOR STORAGE DEVICE

(71) Applicant: Kioxia Corporation, Tokyo (JP)

(72) Inventors: Kazuki Akamine, Yokkaichi Mie (JP); Shigeki Kobayashi, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 449 days.

(21) Appl. No.: 18/462,709

(22) Filed: Sep. 7, 2023

(65) Prior Publication Data

US 2024/0099032 A1 Mar. 21, 2024

(30) Foreign Application Priority Data

Sep. 20, 2022 (JP) ................................ 2022-148921

(51) Int. Cl.
*H10B 80/00* (2026.01)
*H10W 90/00* (2026.01)

(52) U.S. Cl.
CPC ............ *H10B 80/00* (2023.02); *H10W 90/00* (2026.01); *H10W 90/792* (2026.01)

(58) Field of Classification Search
CPC ........ H10B 80/00; H10B 43/50; H10B 43/27; H10W 90/00; H10W 90/792
See application file for complete search history.

(56) References Cited

U.S. PATENT DOCUMENTS 9,589,981 B2 3/2017 Nishikawa et al.
9,960,173 B2 5/2018 Shimojo
10,763,277 B2 9/2020 Oike et al.
2018/0204619 A1 7/2018 Futatsuyama et al.
2019/0214404 A1* 7/2019 Ahn ....................... H10B 43/35
2019/0287995 A1 9/2019 Oike et al.
2019/0371382 A1* 12/2019 Futatsuyama ............ G11C 8/08
2020/0295037 A1 9/2020 Iijima et al.
2021/0118862 A1 4/2021 Maejima et al.
2021/0159239 A1 5/2021 Kato et al.
2022/0270992 A1 8/2022 Wada
2023/0180488 A1 6/2023 Kobayashi

FOREIGN PATENT DOCUMENTS

| | | | |
|---|---|---|---|
| JP | 2019161059 | A | 9/2019 |
| JP | 2020150037 | A | 9/2020 |
| JP | 2021064731 | A | 4/2021 |
| TW | 202127632 | A | 7/2021 |
| TW | 202234674 | A | 9/2022 |
| WO | 2017081756 | A1 | 5/2017 |

* cited by examiner

*Primary Examiner* — Timor Karimy
(74) *Attorney, Agent, or Firm* — Holtz, Holtz & Volek PC

(57) ABSTRACT

A semiconductor storage device includes: a stacked body in which a plurality of electrically conductive layers is stacked with an insulating layer interposed in between; and a circuit section that is provided to overlap with the stacked body in a stack direction. The stacked body includes a memory section in which a plurality of memory cells is disposed and a staircase section in which the plurality of electrically conductive layers has stepped ends. The circuit section includes row decoders that are joined to the plurality of electrically conductive layers. The staircase section includes a first structure in which the row decoders are provided to overlap with each other in the stack direction and a second structure different from the first structure. The second structure has a greater step gap than a step gap of the first structure.

9 Claims, 16 Drawing Sheets

SEMICONDUCTOR STORAGE DEVICE

CROSS-REFERENCE TO RELATED APPLICATION

This application is based upon and claims the benefit of priority from Japanese Patent Application No. 2022-148921, filed on Sep. 20, 2022, the entire contents of which are incorporated herein by reference.

BACKGROUND OF THE INVENTION

Field of the Invention

A present embodiment relates to a semiconductor storage device.

Description of the Related Art

Examples of semiconductor storage devices include a semiconductor storage device in which a plurality of electrically conductive layers is stacked with insulating layers interposed in between and a staircase section is formed.

DETAILED DESCRIPTION OF THE PREFERRED EMBODIMENT

Hereinafter, a present embodiment will be described with reference to the accompanying drawings. For easy understanding of the description, identical components throughout the drawings are denoted by identical reference signs as much as possible and overlapped descriptions will be omitted.

Figure 1:
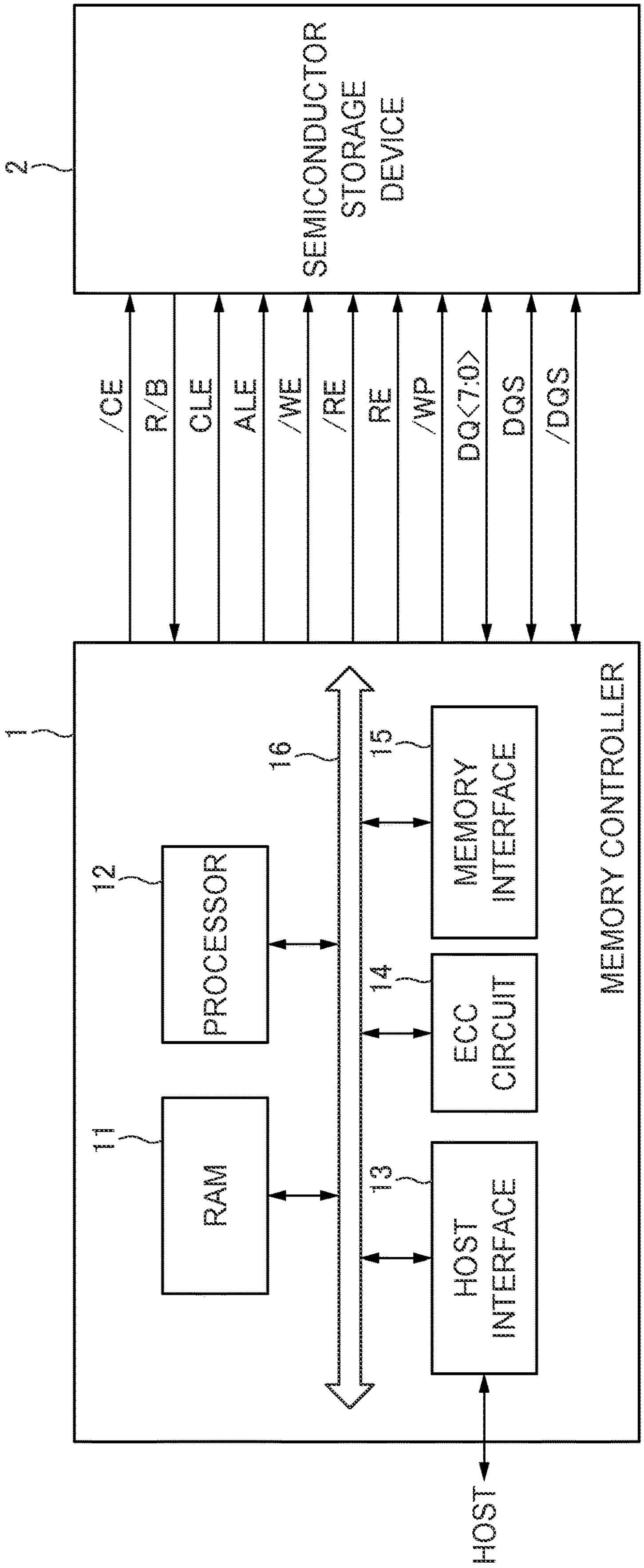
FIG. 1 is a block diagram illustrating a configuration example of a memory system according to the present embodiment.

A semiconductor storage device 2 according to the present embodiment is a NAND flash memory capable of storing, for example, data in a non-volatile manner. FIG. 1 is a block diagram illustrating a configuration example of a memory system including the semiconductor storage device 2. This memory system includes a memory controller 1 and the semiconductor storage device 2. FIG. 1 illustrates an example in which the memory system includes the one semiconductor storage device 2, but the memory system may include a plurality of semiconductor storage devices 2. A specific configuration of the semiconductor storage device 2 will be described below. This memory system is connectable to a host that is not illustrated. The host is, for example, an electronic apparatus such as a personal computer or a portable terminal.

The memory controller 1 controls data writing in the semiconductor storage device 2 in accordance with a write request from the host. In addition, the memory controller 1 controls data readout from the semiconductor storage device 2 in accordance with a readout request from the host.

The respective signals of a chip enable signal /CE, a ready/busy signal R/B, a command latch enable signal CLE, an address latch enable signal ALE, a write enable signal /WE, read enable signals /RE and RE, a write protect signal /WP, a signal DQ<7:0> serving as data, and data strobe signals DQS and /DQS are transmitted and received between the memory controller 1 and the semiconductor storage device 2.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other through an internal bus 16.

The host interface 13 outputs, to the internal bus 16, a request, user data (write data), and the like received from the host. In addition, the host interface 13 transmits, to the host, user data read out from the semiconductor storage device 2, a response from the processor 12, and the like.

The memory interface 15 controls a process of writing user data and the like in the semiconductor storage device 2 and a process of reading out user data and the like from the semiconductor storage device 2 on the basis of instructions from the processor 12.

The processor 12 integrally controls the memory controller 1. The processor 12 is, for example, a CPU, an MPU, or the like. When receiving a request from the host via the host interface 13, the processor 12 performs control in accordance with the request. For example, the processor 12 instructs the memory interface 15 to write user data and a parity in the semiconductor storage device 2 in accordance with the request from the host. In addition, the processor 12 instructs the memory interface 15 to read out user data and a parity from the semiconductor storage device 2 in accordance with the request from the host.

The processor 12 determines a storage region (memory region) in the semiconductor storage device 2 for user data stored in the RAM 11. The user data is stored in the RAM 11 via the internal bus 16. The processor 12 determines a memory region for data (page data) corresponding to a paging unit that is a writing unit. User data stored in one page of the semiconductor storage device 2 will also be referred to as "unit data" below. The unit data is typically encoded and stored in the semiconductor storage device 2 as a code word. The present embodiment does not necessarily entail encoding. The memory controller 1 may store unit data in the semiconductor storage device 2 without encoding the unit data. FIG. 1, however, illustrates, as a configuration example, a configuration in which encoding is performed.

The processor 12 determines a memory region of the semiconductor storage device 2 per unit data. The unit data is written in the memory region. A physical address is assigned to a memory region of the semiconductor storage device 2. The processor 12 manages a memory region in which unit data is written by using the physical address. The processor 12 designates the determined memory region (physical address) and instructs the memory interface 15 to write user data in the semiconductor storage device 2. The processor 12 manages the correspondence between the logical address (the logical address managed by the host) of the user data and the physical address. When receiving a readout request including a logical address from the host, the processor 12 identifies the physical address corresponding to the logical address, designates the physical address, and instructs the memory interface 15 to read out the unit data.

The ECC circuit 14 encodes user data stored in the RAM 11 to generate a code word. In addition, the ECC circuit 14 decodes a code word read out from the semiconductor storage device 2. The ECC circuit 14 detects an error in unit data by using, for example, a checksum or the like provided to the data and corrects the error.

The RAM 11 temporarily stores user data received from the host until the user data is stored in the semiconductor storage device 2. In addition, the RAM 11 temporarily stores user data read out from the semiconductor storage device 2 until the user data is transmitted to the host. The RAM 11 is, for example, a general-purpose memory such as an SRAM or a DRAM.

FIG. 1 illustrates a configuration example in which the memory controller 1 includes the ECC circuit 14 and the memory interface 15. The ECC circuit 14 may be, however, incorporated in the memory interface 15. Alternatively, the ECC circuit 14 may be incorporated in the semiconductor storage device 2. A specific configuration and disposition of each of the elements illustrated in FIG. 1 are not particularly limited.

Figure 2:
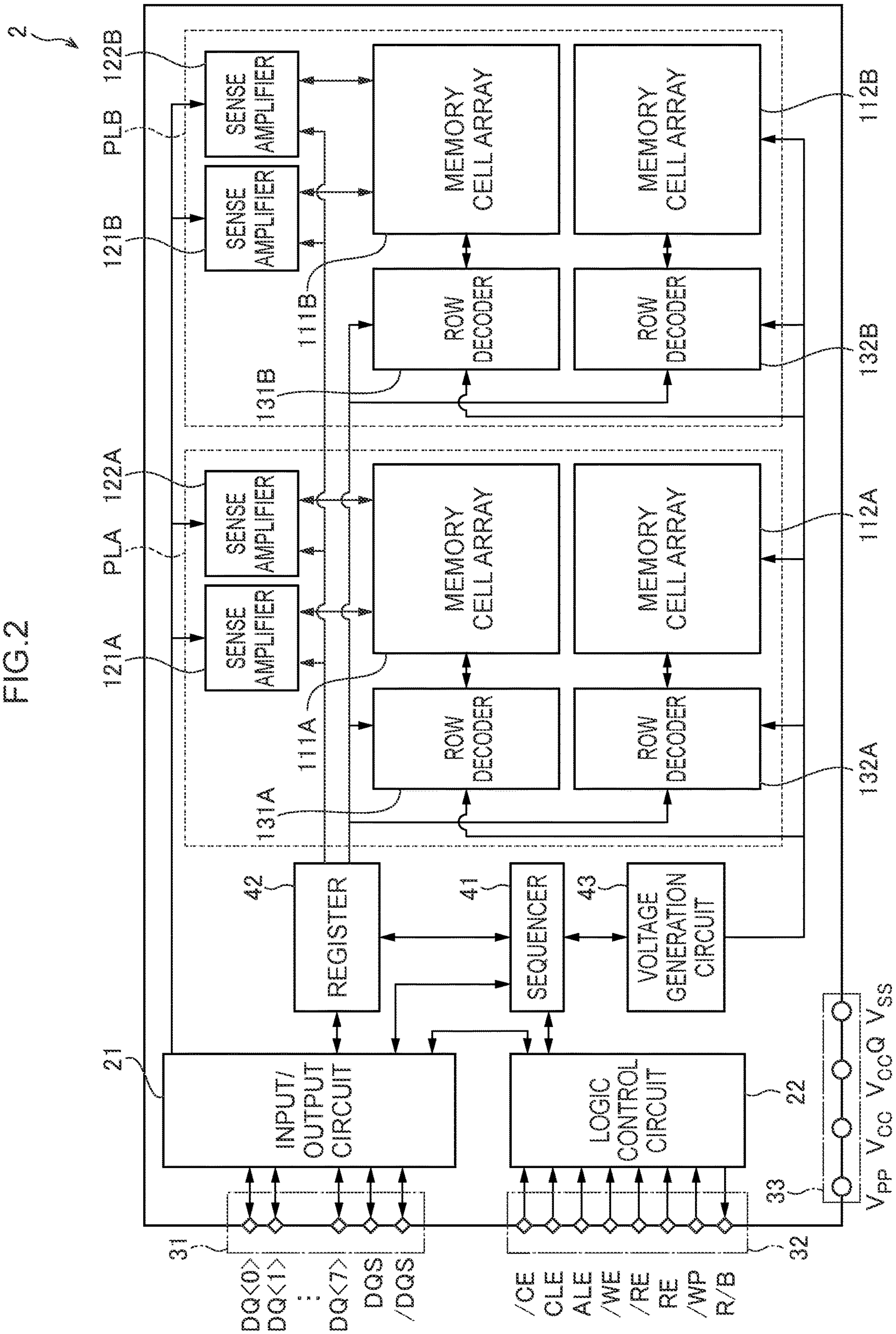
FIG. 2 is a block diagram illustrating a configuration example of a semiconductor storage device according to the present embodiment.

A configuration of the semiconductor storage device 2 will be described by chiefly referring to FIG. 2. As illustrated in FIG. 2, the semiconductor storage device 2 includes two planes PLA and PLB, an input/output circuit 21, a logic control circuit 22, a sequencer 41, a register 42, a voltage generation circuit 43, an input/output pad group 31, a logic control pad group 32, and a power supply input terminal group 33.

The plane PLA includes a memory cell array 111A, a memory cell array 112A, a sense amplifier 121A, a sense amplifier 122A, a row decoder 131A, and a row decoder 132A. The plane PLB includes a memory cell array 111B, a memory cell array 112B, a sense amplifier 121B, a sense amplifier 122B, a row decoder 131B, and a row decoder 132B.

The configuration of the plane PLA and the configuration of the plane PLB are the same. The configuration of the memory cell array 111A and the configuration of the memory cell array 111B are the same. The configuration of the memory cell array 112A and the configuration of the memory cell array 112B are the same. The configuration of the sense amplifier 121A and the configuration of the sense amplifier 121B are the same. The configuration of the sense amplifier 122A and the configuration of the sense amplifier 122B are the same. The configuration of the row decoder 131A and the configuration of the row decoder 131B are the same. The configuration of the row decoder 132A and the configuration of the row decoder 132B are the same. The number of planes provided in the semiconductor storage device 2 may be two as exemplified in FIG. 2, but may also be three or more.

The memory cell arrays 111A, 112A, 111B and 112B each store data. The memory cell arrays 111A, 112A, 111B and 112B each include a plurality of memory cell transistors associated with word lines and bit lines. The memory cell array 111A and the memory cell array 112A share bit lines. The memory cell array 111B and the memory cell array 112B share bit lines.

A group of the bit lines of the memory cell arrays 111A and 112A is joined to the sense amplifier 121A and another group of the bit lines of the memory cell arrays 111A and 112A is joined to the sense amplifier 122A. A group of the bit lines of the memory cell arrays 111B and 112B is joined to the sense amplifier 121B and another group of the bit lines of the memory cell arrays 111B and 112B is joined to the sense amplifier 122B.

The word lines of the memory cell array 111A are joined to the row decoder 131A. The word lines of the memory cell array 112A are joined to the row decoder 132A. The word lines of the memory cell array 111B are joined to the row decoder 131B. The word lines of the memory cell array 112B are joined to the row decoder 132B.

The input/output circuit 21 transmits or receives the signal DQ<7:0> and the data strobe signals DQS and /DQS to and from the memory controller 1. The input/output circuit 21 transfers a command and an address in the signal DQ<7:0> to the register 42. In addition, the input/output circuit 21 transmits and receives pieces of write data and pieces of readout data to and from the sense amplifier 121A, the sense amplifier 122A, the sense amplifier 121B, and the sense amplifier 122B. The input/output circuit 21 has both a function of an "input circuit" that receives a command or the like from the memory controller 1 and a function of an "output circuit" that outputs data to the memory controller 1. Instead of such a configuration, a configuration may be adopted in which the input circuit and the output circuit are configured as different circuits.

The logic control circuit 22 receives the chip enable signal /CE, the command latch enable signal CLE, the address latch enable signal ALE, the write enable signal /WE, the read enable signals RE and /RE, and the write protect signal /WP from the memory controller 1. In addition, the logic control circuit 22 transmits the ready/busy signal R/B to the memory controller 1 to notify the outside of the state of the semiconductor storage device 2.

The input/output circuit 21 and the logic control circuit 22 both receive and output signals from and to the memory controller 1. In short, the input/output circuit 21 and the logic control circuit 22 each function as an interface circuit of the semiconductor storage device 2.

The sequencer 41 controls an operation of each of the sections such as the planes PLA and PLB and the voltage generation circuit 43 on the basis of a control signal input to the semiconductor storage device 2 from the memory controller 1. The sequencer 41 functions as part of a "control circuit" that controls operations of the memory cell array 111A, the memory cell array 112A, the memory cell array 111B, the memory cell array 112B, and the like. The logic control circuit 22 functions as other part of the "control circuit".

The register 42 temporarily holds a command or an address. The register 42 holds even status information indicating the state of each of the planes PLA and PLB. The status information is read out from the register 42 in response to a request from the memory controller 1 and output to the memory controller 1 from the input/output circuit 21 as a state signal.

The voltage generation circuit 43 generates respective voltages necessary to perform an operation of writing data, an operation of reading out data, and an operation of erasing data in the memory cell arrays 111A, 112A, 111B and 112B on the basis of instructions from the sequencer 41. Such voltages include, for example, a voltage such as VPGM, VPASS_PGM, or VPASS_READ applied to word lines WL described below, a voltage applied to bit lines BL described below, and the like. The voltage generation circuit 43 is capable of individually applying voltages to the respective word lines WL, the respective bit lines BL, and the like to allow the plane PLA and the plane PLB to operate in parallel.

The input/output pad group 31 includes a plurality of terminals (pads) for transmitting and receiving respective signals between the memory controller 1 and the input/output circuit 21. The respective terminals are individually provided for the signal DQ<7:0> and the data strobe signals DQS and /DQS.

The logic control pad group 32 includes a plurality of terminals (pads) for transmitting and receiving respective signals between the memory controller 1 and the logic control circuit 22. The respective terminals are individually provided for the chip enable signal /CE, the command latch enable signal CLE, the address latch enable signal ALE, the write enable signal /WE, the read enable signals RE and /RE, the write protect signal /WP, and the ready/busy signal R/B.

The power supply input terminal group 33 includes a plurality of terminals for receiving respective applied voltages necessary for an operation of the semiconductor storage device 2. The voltages applied to the respective terminals include power supply voltages Vcc, VccQ, and Vpp and a ground voltage Vss.

The power supply voltage Vcc is a power supply voltage provided from the outside as an operation power supply. The power supply voltage Vcc is, for example, a voltage of about 3.3 V. The power supply voltage VccQ is, for example, a voltage of 1.2 V. The power supply voltage VccQ is a voltage used to transmit and receive signals between the memory controller 1 and the semiconductor storage device 2. The power supply voltage Vpp is a power supply voltage higher than the power supply voltage Vcc. The power supply voltage Vpp is, for example, a voltage of 12 V.

A high voltage (VPGM) of about 20 V is necessary to write pieces of data in the memory cell arrays 111A, 112A, 111B and 112B or erase pieces of data from the memory cell arrays 111A, 112A, 111B and 112B. In this case, it is possible to generate a desired voltage at a higher speed and with less power consumption by boosting the power supply voltage Vpp of about 12 V than boosting the power supply voltage Vcc of about 3.3 V with a booster circuit of the voltage generation circuit 43. Meanwhile, for example, when the semiconductor storage device 2 is used in an environment in which it is not possible to supply a high voltage, the power supply voltage Vpp does not have to be supplied with any voltage. Even if the power supply voltage Vpp is not supplied, it is possible for the semiconductor storage device 2 to execute a variety of operations as long as the power supply voltage Vcc is supplied. In short, the power supply voltage Vcc is a power supply that is standardly supplied to the semiconductor storage device 2 and the power supply voltage Vpp is a power supply that is additionally or optionally supplied, for example, in accordance with the use environment.

Figure 3:
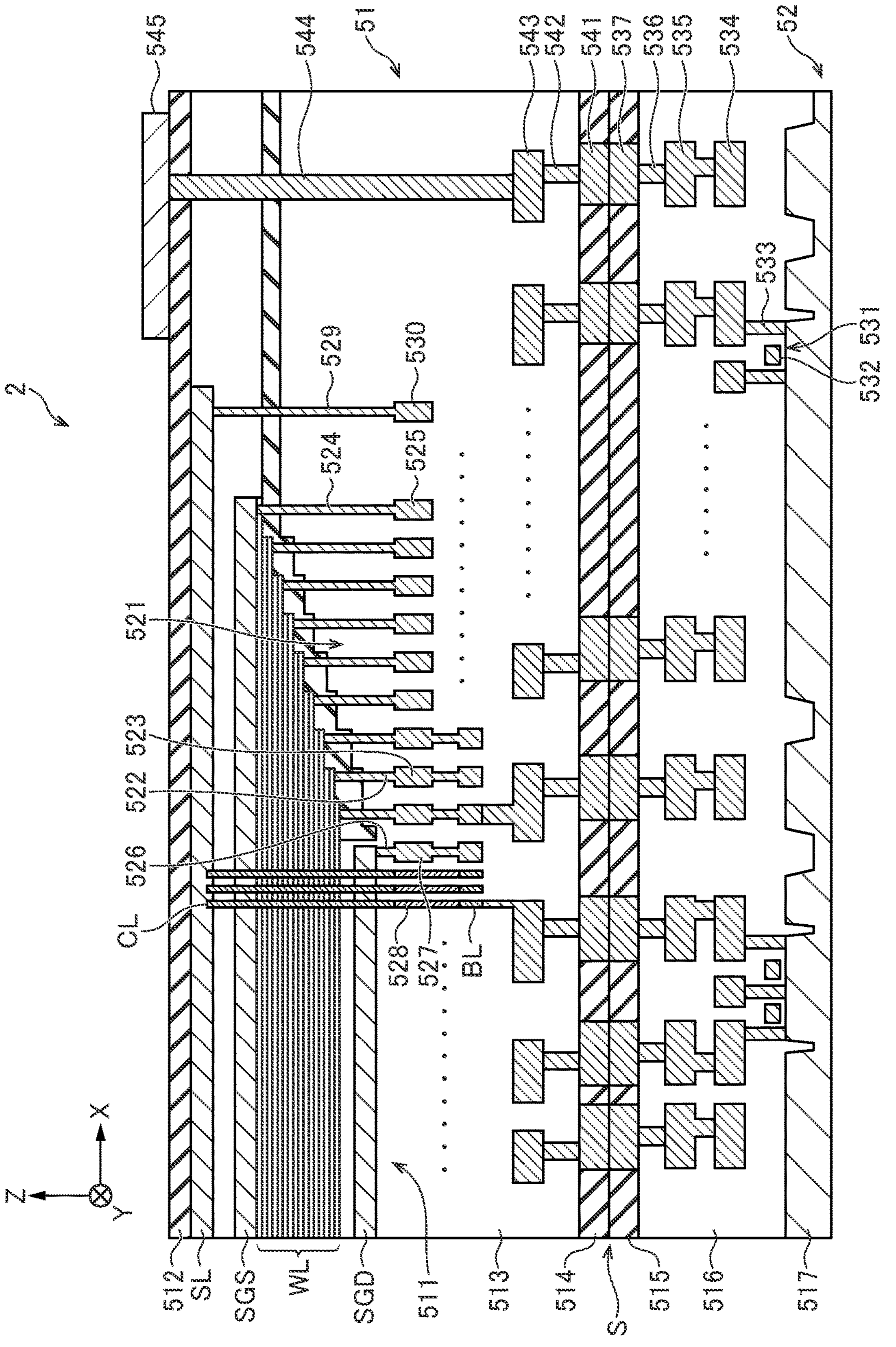
FIG. 3 is a cross-sectional view of a structure example of the semiconductor storage device according to the present embodiment.

The structure of the semiconductor storage device 2 according to the first embodiment will be described with reference to FIG. 3. FIG. 3 is a cross-sectional view of the structure of the semiconductor storage device 2. The semiconductor storage device 2 is a three-dimensional memory in which an array chip 51 and a circuit chip 52 are bonded together.

The array chip 51 includes a memory cell array 511, an insulating film 512 above the memory cell array 511, an interlayer insulating film 513 below the memory cell array 511, and an insulating film 514 below the interlayer insulating film 513. The memory cell array 511 includes a plurality of memory cells. Each of the insulating films 512 and 514 includes, for example, a film including silicon and oxygen or a film including silicon and nitrogen.

The circuit chip 52 is provided below the array chip 51. Reference character S denotes the bonded surface between the array chip 51 and the circuit chip 52. The circuit chip 52 includes an insulating film 515, an interlayer insulating film 516 below the insulating film 515, and a substrate 517 below the interlayer insulating film 516. The insulating film 515 includes, for example, a film including silicon and oxygen or a film including silicon and nitrogen. The substrate 517 is a layer such as a silicon substrate including, for example, a semiconductor material.

FIG. 3 illustrates an X direction, a Y direction, and a Z direction. The X direction and the Y direction are parallel to a surface of the substrate 517 and vertical to each other. The Z direction is vertical to the surface of the substrate 517 and intersects the substrate 517. In this specification, a +Z direction represents an up direction and a −Z direction represents a down direction. For example, the memory cell array 511 is positioned above the substrate 517 and the substrate 517 is positioned below the memory cell array 511. The −Z direction may coincide with the gravity direction or not.

The array chip 51 includes the plurality of word lines WL, a source-side selection gate SGS, a drain-side selection gate SGD, and a source line SL as electrode layers in the memory cell array 511. FIG. 3 illustrates a staircase section 521 of the memory cell array 511. As illustrated in FIG. 3, each of the word lines WL is electrically connected to a word wiring layer 523 through a contact plug 522. The source-side selection gate SGS is electrically connected to a source-side selection gate wiring layer 525 through a contact plug 524. Further, the drain-side selection gate SGD is electrically connected to a drain-side selection gate wiring layer 527 through a contact plug 526. The source line SL is electrically connected to a source wiring layer 530 through a contact plug 529. A column-shaped section CL penetrates the word lines WL, the source-side selection gate SGS, and the drain-side selection gate SGD. The column-shaped section CL is electrically connected to the bit lines BL through a plug 528 and electrically connected to the source line SL.

The circuit chip 52 includes a plurality of transistors 531. Each of the transistors 531 includes a gate electrode 532, a source diffusion layer, and a drain diffusion layer. The gate electrode 532 is provided above the substrate 517 with a gate insulating film interposed in between. The source diffusion layer and the drain diffusion layer are provided in the substrate 517, but not illustrated. The circuit chip 52 further includes a plurality of plugs 533, a wiring layer 534, and a wiring layer 535. The plurality of plugs 533 is provided on the source diffusion layers or the drain diffusion layers of those transistors 531. The wiring layer 534 is provided above these plugs 533 and includes a plurality of wiring lines. The wiring layer 535 is provided above the wiring layer 534 and includes a plurality of wiring lines. The circuit chip 52 further includes a plurality of via plugs 536 and a plurality of metal pads 537. The plurality of via plugs 536 is provided on the wiring layer 535. The plurality of metal pads 537 is provided on these via plugs 536 in the insulating film 515. The metal pads 537 each include, for example, Cu (copper) or Al (aluminum). The circuit chip 52 functions as a control circuit (logic circuit) that controls the array chip 51. This control circuit includes the transistors 531 and the like. The control circuit is electrically connected to the metal pads 537.

The array chip 51 includes a plurality of metal pads 541, a plurality of via plugs 542, and a wiring layer 543. The plurality of metal pads 541 is provided on the metal pads 537. The plurality of via plugs 542 is provided on the metal pads 541. The wiring layer 543 includes a plurality of wiring lines. The metal pads 541 are provided in the insulating film 514. The wiring lines in the wiring layer 543 are provided on the via plugs 542. The respective word lines WL and the respective bit lines BL are electrically connected to the corresponding wiring lines in the wiring layer 543. The metal pads 541 each include, for example, Cu or Al. The array chip 51 further includes a via plug 544 and a metal pad 545. The via plug 544 is provided on the wiring layer 543. The metal pad 545 is provided on the insulating film 512 and the via plug 544. The via plug 544 is provided in the interlayer insulating film 513 and the insulating film 512. The metal pads 545 each include, for example, Cu or Al. In addition, the metal pad 545 functions as an external connection pad (bonding pad) of the semiconductor storage device 2. The metal pad 545 is connectable to a mounting substrate or another device through a bonding wire, a solder ball, a metal bump, or the like.

The memory cell arrays 111A, 112A, 111B and 112B described with reference to FIG. 2 are included in the array chip 51 and correspond to the memory cell array 511. The sense amplifier 121A, the sense amplifier 122A, the row decoders 131A and 132A, the sense amplifiers 121B and 122B, and the row decoders 131B and 132B described with reference to FIG. 2 are included in the circuit chip 52 and correspond to the control circuit.

Figure 4:
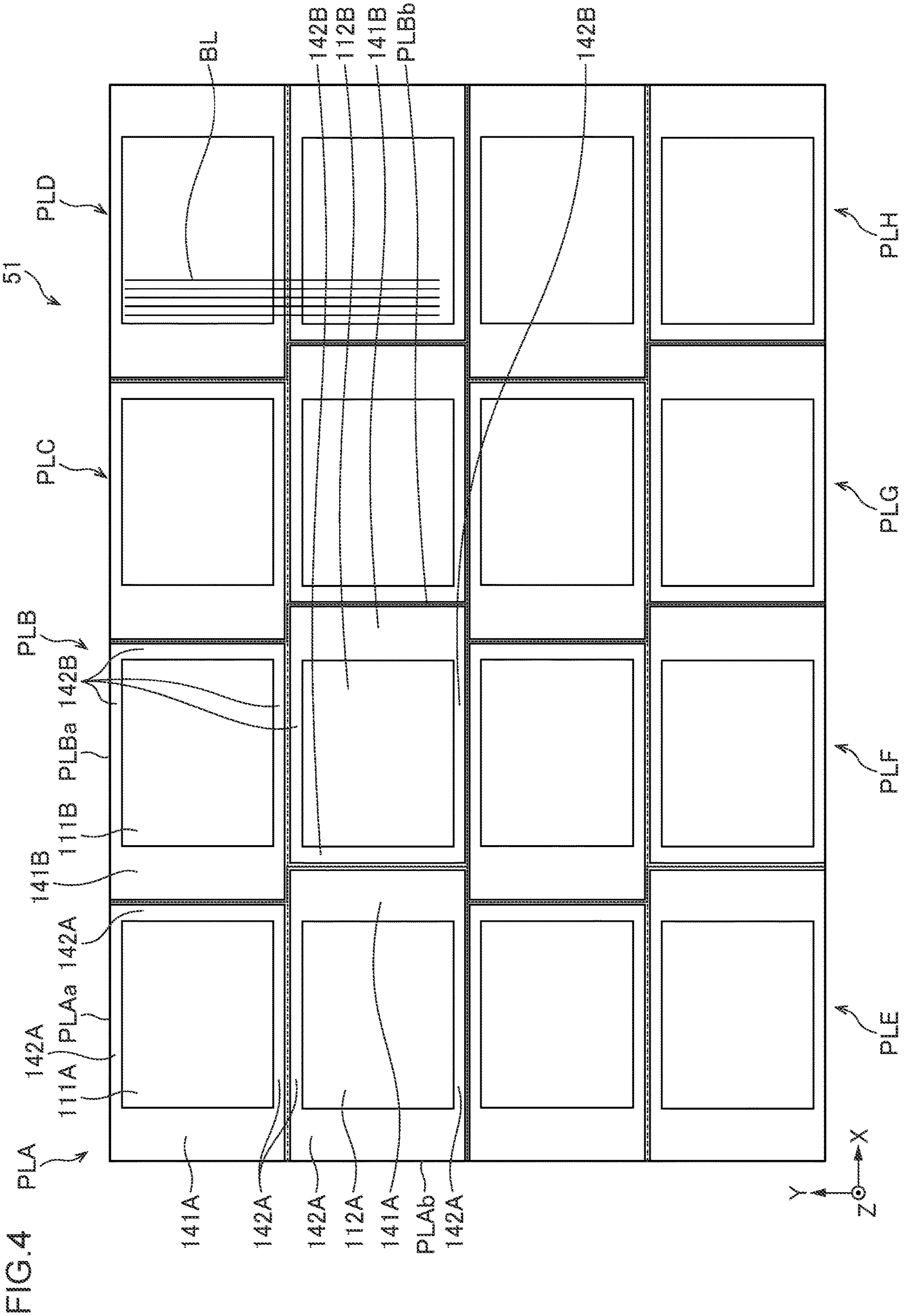
FIG. 4 is a diagram illustrating a disposition configuration on an array chip side of the semiconductor storage device according to the present embodiment.
Figure 5:
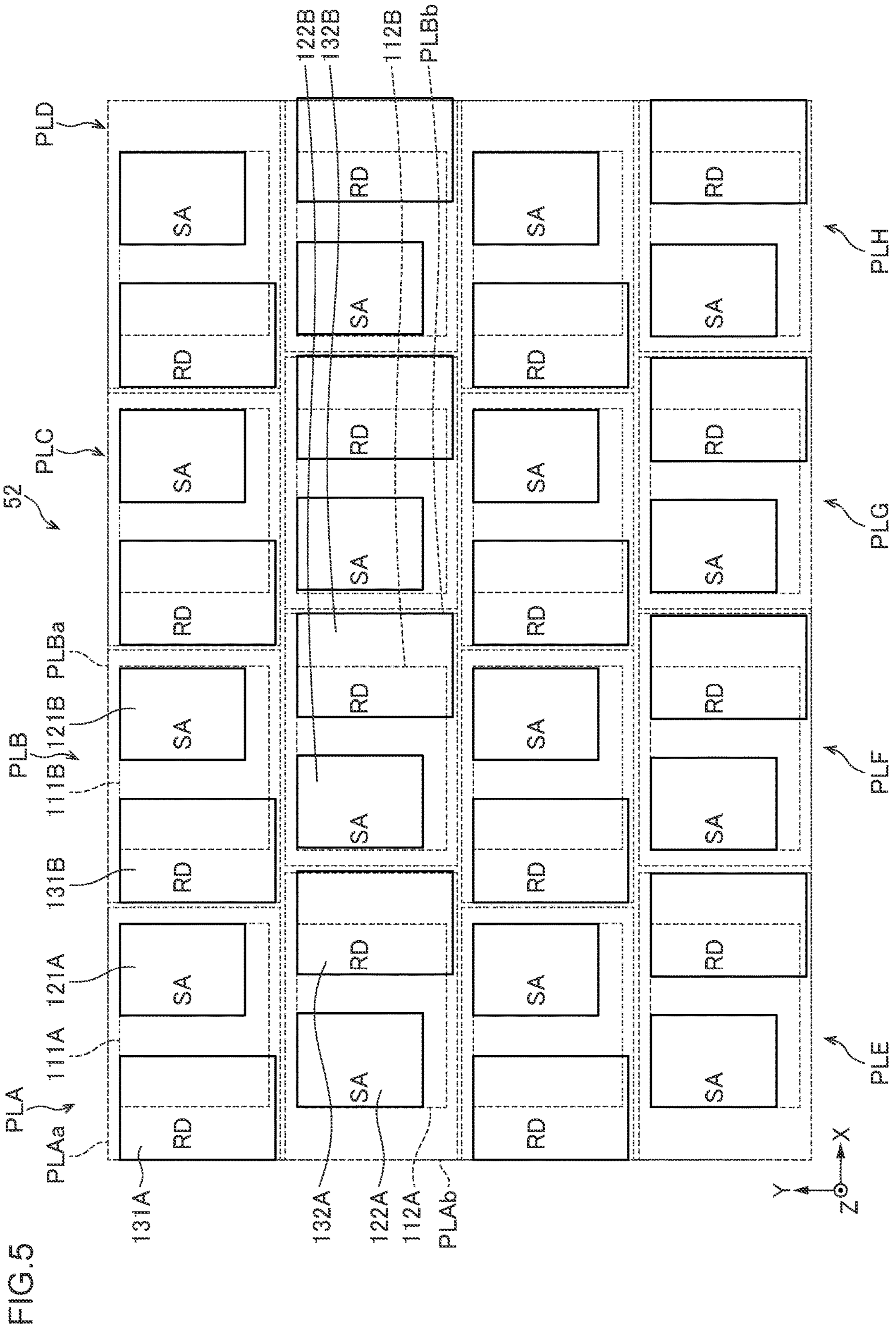
FIG. 5 is a diagram illustrating a disposition configuration on a circuit chip side of the semiconductor storage device according to the present embodiment.

Subsequently, the disposition configuration of a staircase section of a memory cell array in the semiconductor storage device 2 will be described with reference to FIGS. 4 and 5. FIG. 4 is a diagram illustrating the disposition configuration on an array chip 51 side of the semiconductor storage device 2. FIG. 5 is a diagram illustrating the disposition configuration on a circuit chip 52 side of the semiconductor storage device 2. It has been described that the semiconductor storage device 2 described with reference to FIGS. 1 and 2 includes two planes. The array chip 51 and the circuit chip 52 of the semiconductor storage device 2 to be described with reference to FIGS. 4 and 5 will be, however, described on the assumption that the eight planes PLA, PLB, PLC, PLD, PLE, PLF, PLG, and PLH are included.

As illustrated in FIG. 4, the planes PLA, PLB, PLC, and PLD are disposed along the X direction. The planes PLE, PLF, PLG, and PLH are disposed along the X direction. The planes PLA and PLE are disposed along the Y direction. The planes PLB and PLF are disposed along the Y direction. The planes PLC and PLG are disposed along the Y direction. The planes PLD and PLH are disposed along the Y direction.

The planes PLA and PLB and the planes PLC and PLD have similar configurations in an XY plane. The disposition of the planes PLE and PLF and the disposition of the planes PLG and PLH display point symmetry in the XY plane with respect to the disposition of the planes PLA, PLB, PLC, and PLD. A description is thus given by using the planes PLA and PLB as an example.

As described with reference to FIG. 2, the plane PLA includes the memory cell arrays 111A and 112A. The memory cell array 111A and the memory cell array 112A share the bit lines BL. The plane PLA includes a plane portion PLAa including the memory cell array 111A and a plane portion PLAb including the memory cell array 112A.

The plane portion PLAa is provided with a normal staircase 141A and a dummy staircase 142A around the memory cell array 111A. The normal staircase 141A includes the staircase section 521 described with reference to FIG. 3. In the normal staircase 141A, the staircase section 521 corresponding to the contact plugs 522 is formed to allow the contact plugs 522 to be directly joined to the respective steps. In contrast, the dummy staircase 142A is a stepped portion that is not joined to the contact plugs 522, but formed together in a step of forming the normal staircase 141A. The dummy staircase 142A is thus formed to have one step of the dummy staircase 142A corresponding to several steps of the normal staircase 141A. A distance from an upper end to a lower end of the dummy staircase 142A in the X direction is thus shorter than a distance from an upper end to a lower end of the normal staircase 141A in the X direction. The dummy staircase 142A has a greater step gap than a step gap of the normal staircase 141A.

The plane portion PLAa is provided with the normal staircase 141A in a −X direction with respect to the memory cell array 111A. The plane portion PLAa is provided with the respective dummy staircases 142A in a +X direction, a +Y direction, and a −Y direction with respect to the memory cell array 111A.

The plane portion PLAb is provided with the normal staircase 141A and the dummy staircase 142A around the memory cell array 112A. The plane portion PLAb is provided with the normal staircase 141A in the +X direction with respect to the memory cell array 112A. The plane portion PLAb is provided with the respective dummy staircases 142A in the −X direction, the +Y direction, and the −Y direction with respect to the memory cell array 112A.

The plane PLB includes the memory cell arrays 111B and 112B. The memory cell array 111B and the memory cell array 112B share the bit lines BL. The plane PLB includes a plane portion PLBa including the memory cell array 111B and a plane portion PLBb including the memory cell array 112B.

The plane portion PLBa is provided with a normal staircase 141B and a dummy staircase 142B around the memory cell array 111B. The normal staircase 141B is a staircase section similar to the normal staircase 141A. The dummy staircase 142B is a staircase section similar to the dummy staircase 142A. A distance from an upper end to a lower end of the dummy staircase 142B in the X direction is thus shorter than a distance from an upper end to a lower end of the normal staircase 141B in the X direction. The dummy staircase 142B has a greater step gap than a step gap of the normal staircase 141B.

The plane portion PLBa is provided with the normal staircase 141B in the −X direction with respect to the memory cell array 111B. The plane portion PLBa is provided with the respective dummy staircases 142B in the +X direction, the +Y direction, and the −Y direction with respect to the memory cell array 111B.

The plane portion PLBb is provided with the normal staircase 141B and the dummy staircase 142B around the memory cell array 112B. The plane portion PLBb is provided with the normal staircase 141B in the +X direction with respect to the memory cell array 112B. The plane portion PLBb is provided with the respective dummy staircases 142B in the −X direction, the +Y direction, and the −Y direction with respect to the memory cell array 112B.

As described with reference to FIG. 2, the plane PLA includes the sense amplifiers 121A and 122A. The memory cell array 111A and the memory cell array 112A of the plane PLA share the bit lines BL. The sense amplifier 121A and the sense amplifier 122A are thus joined to separately take charge of the bit lines BL of the memory cell arrays 111A and 112A.

The plane PLA includes the row decoders 131A and 132A. The row decoder 131A is joined to the memory cell array 111A. The row decoder 132A is joined to the memory cell array 112A.

The plane PLB includes the sense amplifiers 121B and 122B. The memory cell array 111B and the memory cell array 112B of the plane PLB share the bit lines BL. The sense amplifier 121B and the sense amplifier 122B are thus joined to separately take charge of the bit lines BL of the memory cell arrays 111B and 112B.

The plane PLB includes the row decoders 131B and 132B. The row decoder 131B is joined to the memory cell array 111B. The row decoder 132B is joined to the memory cell array 112B.

As illustrated in FIG. 5, the plane portion PLAa including the memory cell array 111A is provided with the sense amplifier 121A and the row decoder 131A. The row decoder 131A is joined to the memory cell array 111A and thus disposed on the normal staircase 141A. The sense amplifier 121A is disposed on the dummy staircase 142A disposed on the opposite side to the normal staircase 141A with the memory cell array 111A interposed in between.

The plane portion PLAb including the memory cell array 112A is provided with the sense amplifier 122A and the row decoder 132A. The row decoder 132A is joined to the memory cell array 112A and thus disposed on the normal staircase 141A. The sense amplifier 122A is disposed on the dummy staircase 142A disposed on the opposite side to the normal staircase 141A with the memory cell array 112A interposed in between.

The plane portion PLBa including the memory cell array 111B is provided with the sense amplifier 121B and the row decoder 131B. The row decoder 131B is joined to the memory cell array 111B and thus disposed on the normal staircase 141B. The sense amplifier 121B is disposed on the dummy staircase 142B disposed on the opposite side to the normal staircase 141B with the memory cell array 111B interposed in between.

The plane portion PLBb including the memory cell array 112B is provided with the sense amplifier 122B and the row decoder 132B. The row decoder 132B is joined to the memory cell array 112B and thus disposed on the normal staircase 141B. The sense amplifier 122B is disposed on the dummy staircase 142B disposed on the opposite side to the normal staircase 141B with the memory cell array 112B interposed in between.

The semiconductor storage device 2 includes a stacked body (array chip 51) and a circuit section (circuit chip 52). A plurality of electrically conductive layers is stacked with an insulating layer interposed in between in the stacked body. The circuit section is provided to overlap with the stacked body in a stack direction. The stacked body includes a memory section (memory cell arrays 111A, 111B, 112A, and 112B) in which a plurality of memory cells is disposed and a staircase section in which a plurality of electrically conductive layers has stepped ends. The circuit section includes the row decoders 131A, 132A, 131B, and 132B that are electrically connected to the plurality of electrically conductive layers. The staircase section includes first structures (normal staircases 141A and 141B) and second structures (dummy staircases 142A and 142B) different from the first structures. The first structures are provided at portions overlapping with the row decoders 131A, 132A, 131B, and 132B in the stack direction. The second structures each have the greater step gap than the step gap of each of the first structures.

The memory section includes a first memory section (memory cell array 111A) and a second memory section (memory cell array 112A). The staircase section includes a first staircase section (the normal staircase 141A on the memory cell array 111A side) and a second staircase section (the normal staircase 141A on the memory cell array 112A side). The first staircase section is joined to the first memory section and includes the first structure. The second staircase section is joined to the second memory section and includes the first structure. The row decoders include a first row decoder (row decoder 131A) and a second row decoder (row decoder 132A). The first row decoder is joined to the first staircase section. The second row decoder is joined to the second staircase section. The first row decoder is provided to overlap with a first side of the memory section and the second row decoder is provided to overlap with a second side of the memory section. The second side is different from the first side.

A third staircase section (the dummy staircase 142A on the memory cell array 111A side) is provided on the second side. The third staircase section is joined to the first memory section and includes the second structure. A fourth staircase section (the dummy staircase 142A on the memory cell array 112A side) is provided on the first side. The fourth staircase section is joined to the second memory section and includes the second structure.

A fifth staircase section (the dummy staircase 142A on the memory cell array 111A side) is provided on a third side that joins the first side and the second side. The fifth staircase section is joined to the first memory section and includes the second structure. A sixth staircase section (the dummy staircase 142A on the memory cell array 112A side) is provided on a fourth side that is different from the third side and joins the first side and the second side. The sixth staircase section is joined to the second memory section and includes the second structure.

The first structure is provided with the contact plug 522 that is electrically joined to a row decoder. The memory cells include drains. Each of the memory cells includes a drain respectively. The first memory section and the second memory section share the bit lines BL that are joined to the drains of the memory cells.

The bit lines BL may be bent between the first memory section and the second memory section.

A seventh staircase section (the dummy staircase 142A on the memory cell array 111A side) is provided between the first memory section and the second memory section. The seventh staircase section is joined to the first memory section and includes the second structure.

An eighth staircase section (the dummy staircase 142A on the memory cell array 112A side) is provided between the first memory section and the second memory section. The eighth staircase section is joined to the second memory section and includes the second structure.

An electrically conductive layer of the first memory section and an electrically conductive layer of the second memory section may be joined. The plurality of memory sections may be provided and the plurality of memory sections may be separated by a slit.

In the example described with reference to FIG. 4, the memory cell array 111A and the memory cell array 112A that share the bit lines BL are disposed at the same positions with respect to the X direction. The dummy staircase 142A on the side on which the sense amplifier 122A is provided occupies the same width in the X direction as that of the normal staircase 141A on the side on which the row decoder 131A is provided. It is possible to decrease a length of the dummy staircase 142A in the X direction as compared with that of the normal staircase 141A. It is thus possible to shift the memory cell array 112A in the −X direction. Such a disposition example will be described as a first modification example.

An array chip 51A according to the first modification example will be described with reference to FIG. 6. The array chip 51A includes eight planes PLA5, PLB5, PLC5, PLD5, PLE5, PLF5, PLG5, and PLH5.

Figure 6:
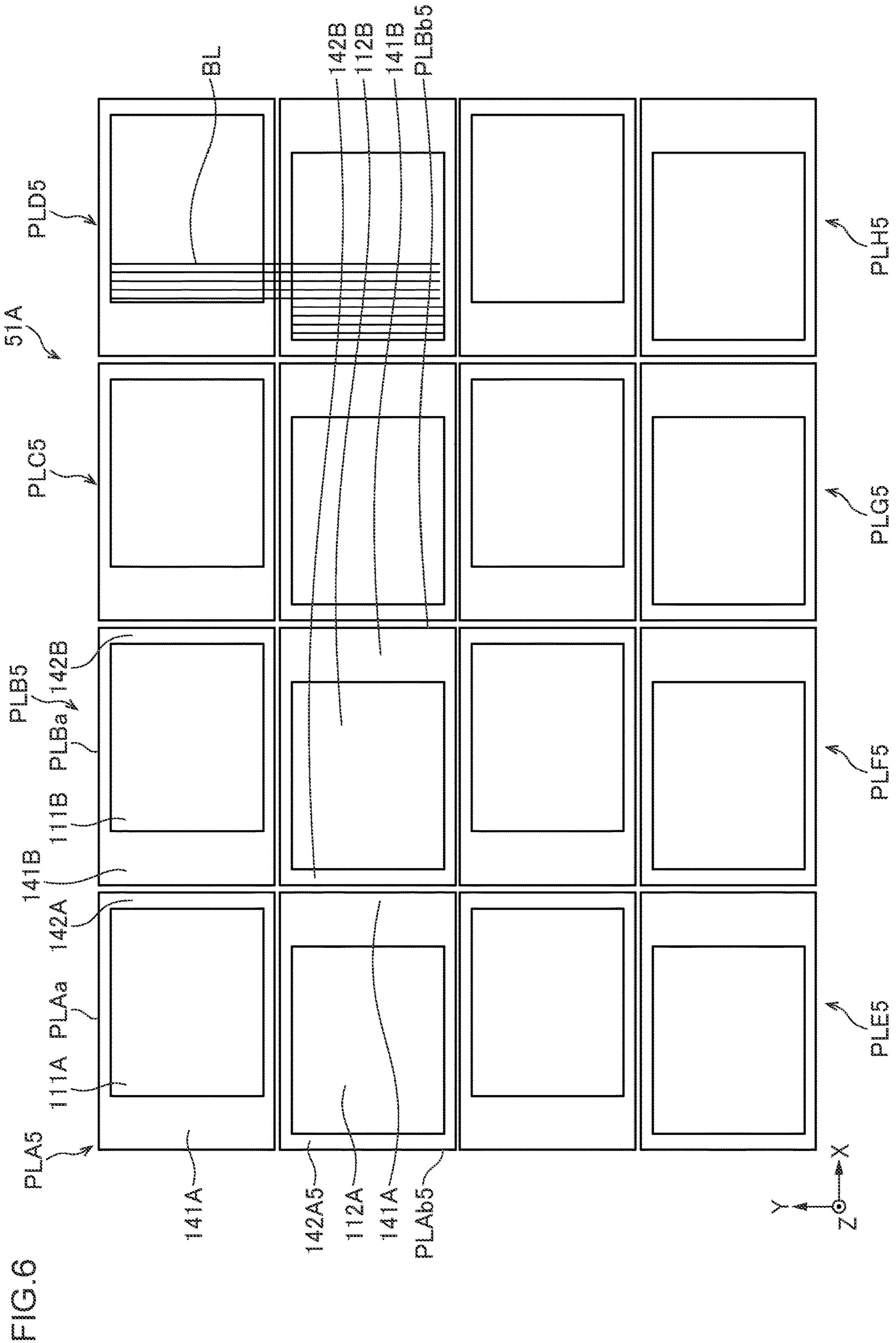
FIG. 6 is a diagram illustrating a disposition configuration on an array chip side of a semiconductor storage device according to a first modification example of the present embodiment.

As illustrated in FIG. 6, the planes PLA5, PLB5, PLC5, and PLD5 are disposed along the X direction. The planes PLE5, PLF5, PLG5, and PLH5 are disposed along the X direction. The planes PLA5 and PLE5 are disposed along the Y direction. The planes PLB5 and PLF5 are disposed along the Y direction. The planes PLC5 and PLG5 are disposed along the Y direction. The planes PLD5 and PLH5 are disposed along the Y direction.

The disposition configuration of the memory cell arrays 111A and 112A of the plane PLA5 is different from that of the plane PLA described with reference to FIG. 4. Specifically, the disposition position of the memory cell array 112A in the plane PLA5 is shifted from the disposition position of the memory cell array 112A of the plane PLA in the −X direction. The disposition of the memory cell array 112A in the X direction is deviated from that of the memory cell array 111A in the −X direction.

The plane PLA5 includes the plane portion PLAa and a plane portion PLAb5. In the plane portion PLAb5, the disposition position of the memory cell array 112A is shifted in the −X direction. A dummy staircase 142A5 is thus provided in a narrow region as with the dummy staircase 142A. The dummy staircase 142A5 has a configuration that is substantially similar to that of the dummy staircase 142A.

The plane portion PLAa and the plane portion PLAb5 have the same length in the X direction. The plane portion PLAa and the plane portion PLAb5 thus have the same rectangular shape.

Similarly, the disposition configuration of the memory cell arrays 111B and 112B of the plane PLB5 is also different from that of the plane PLB described with reference to FIG. 4. Specifically, the disposition position of the memory cell array 112B in the plane PLB5 is shifted from the disposition position of the memory cell array 112B of the plane PLB in the −X direction. The disposition of the memory cell array 112B in the X direction is deviated from that of the memory cell array 111B in the −X direction.

The plane PLB5 includes the plane portion PLBa and a plane portion PLBb5. The disposition position of the memory cell array 112B of the plane portion PLBb5 is shifted in the −X direction. The memory cell array 112B is shifted in the −X direction in the plane portion PLBb5 as much as the memory cell array 112B is shifted in the −X direction in the plane portion PLAb5. The dummy staircase 142B is thus provided in a narrow region as before the disposition position is shifted. The plane portion PLBa and the plane portion PLBb5 have the same length in the X direction. The plane portion PLBa and the plane portion PLBb5 thus have the same rectangular shape.

The disposition configuration of the memory cell arrays 111A and 112A in the plane PLA5 and the disposition configuration of the memory cell arrays 111B and 112B in the plane PLB5 are similar. The plane PLA5 and the plane PLB5 thus have similar configurations. Similarly, the planes PLC5, PLD5, PLE5, PLF5, PLG5, and PLH5 also have configurations similar to those of the planes PLA5 and PLB5.

The plane PLA5 includes the plane portion PLAa including the memory cell array 111A and the plane portion PLAb5 including the memory cell array 112B. The memory cell array 111A and the memory cell array 112A share the bit lines BL. In the example of FIG. 6, the bit lines BL are shared in regions that overlap with each other in the X direction, but the bit lines BL are not shared in regions that do not overlap with each other in the X direction. The sense amplifier 121A provided in the plane portion PLAa is joined to the bit lines BL provided in the memory cell array 111A alone and a group of the bit lines BL shared between the memory cell array 111A and the memory cell array 112A. The sense amplifier 122A provided in the plane portion PLAb5 is joined to the bit lines BL provided in the memory cell array 112A alone and the another group of the bit lines BL shared between the memory cell array 111A and the memory cell array 112A.

In the example described in the first modification example with reference to FIG. 6, the example has been described in which the length of a group of the bit lines BL is different from the length of another group of the bit lines BL. An example will be described as a second modification example with reference to FIG. 7 in which the bit lines BL have uniform length while the memory cell arrays have the disposition configuration illustrated in FIG. 6.

An array chip 51B according to the second modification example will be described with reference to FIG. 7. A description is given on the assumption that the array chip 51B includes eight planes PLA6, PLB6, PLC6, PLD6, PLE6, PLF6, PLG6, and PLH6.

Figure 7:
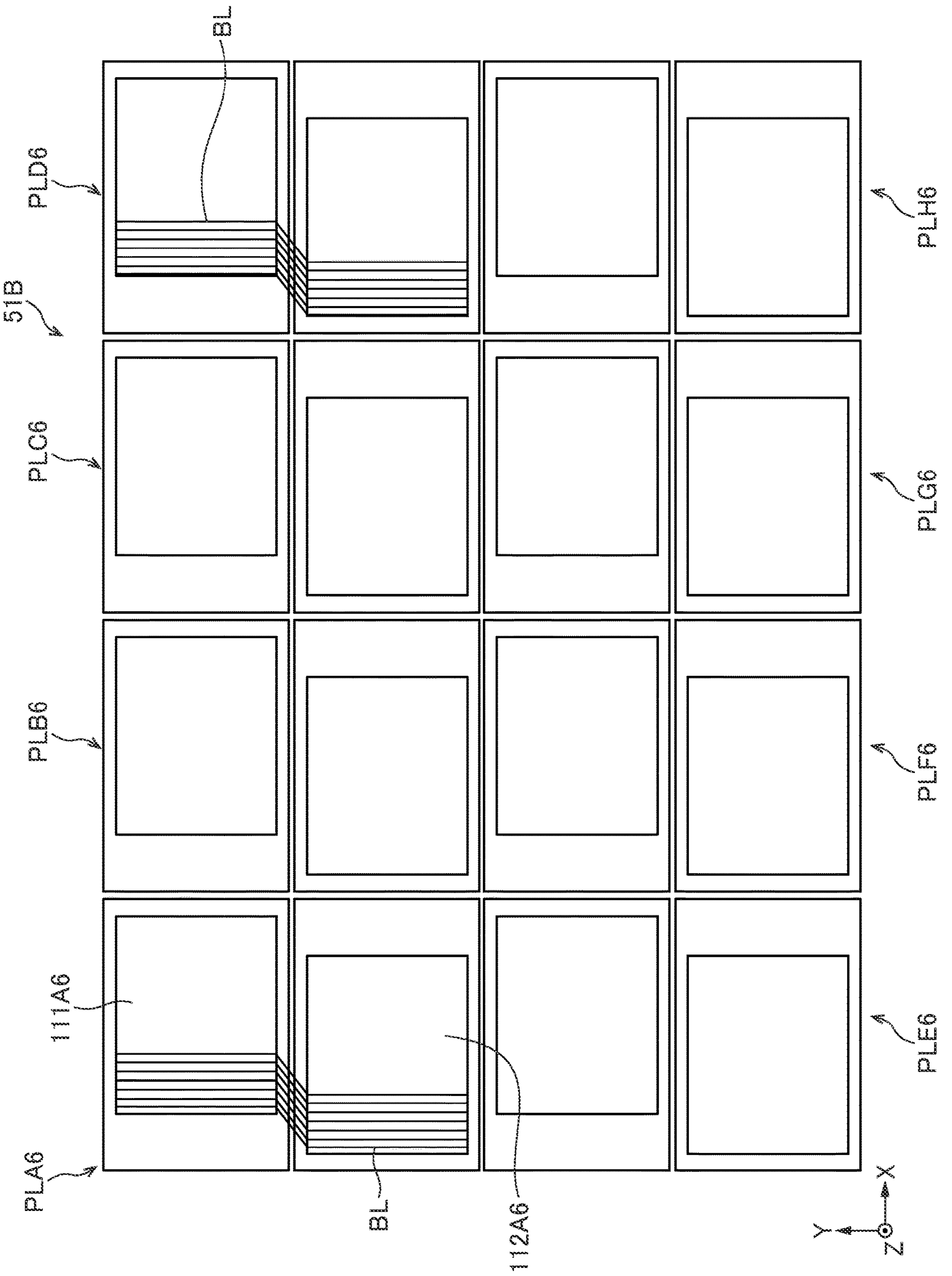
FIG. 7 is a diagram illustrating a disposition configuration on an array chip side of a semiconductor storage device according to a second modification example of the present embodiment.

As illustrated in FIG. 7, the planes PLA6, PLB6, PLC6, and PLD6 are disposed along the X direction. The planes PLE6, PLF6, PLG6, and PLH6 are disposed along the X direction. The planes PLA6 and PLE6 are disposed along the Y direction. The planes PLB6 and PLF6 are disposed along the Y direction. The planes PLC6 and PLG6 are disposed along the Y direction. The planes PLD6 and PLH6 are disposed along the Y direction.

The plane PLA6 includes memory cell arrays 111A6 and 112A6. The disposition configuration of the memory cell arrays 111A6 and 112A6 of the plane PLA6 is similar to the disposition configuration of the memory cell arrays 111A and 112A of the plane PLA5 described with reference to FIG. 6.

Different from the memory cell arrays 111A and 112A, the memory cell arrays 111A6 and 112A6 share all the bit lines BL. The memory cell array 111A6 and the memory cell array 112A6 share all the bit lines BL by bending the bit lines BL. Sharing all the bit lines BL while bending the bit lines BL allows the respective bit lines BL to have uniform electrical characteristics.

Figure 8:
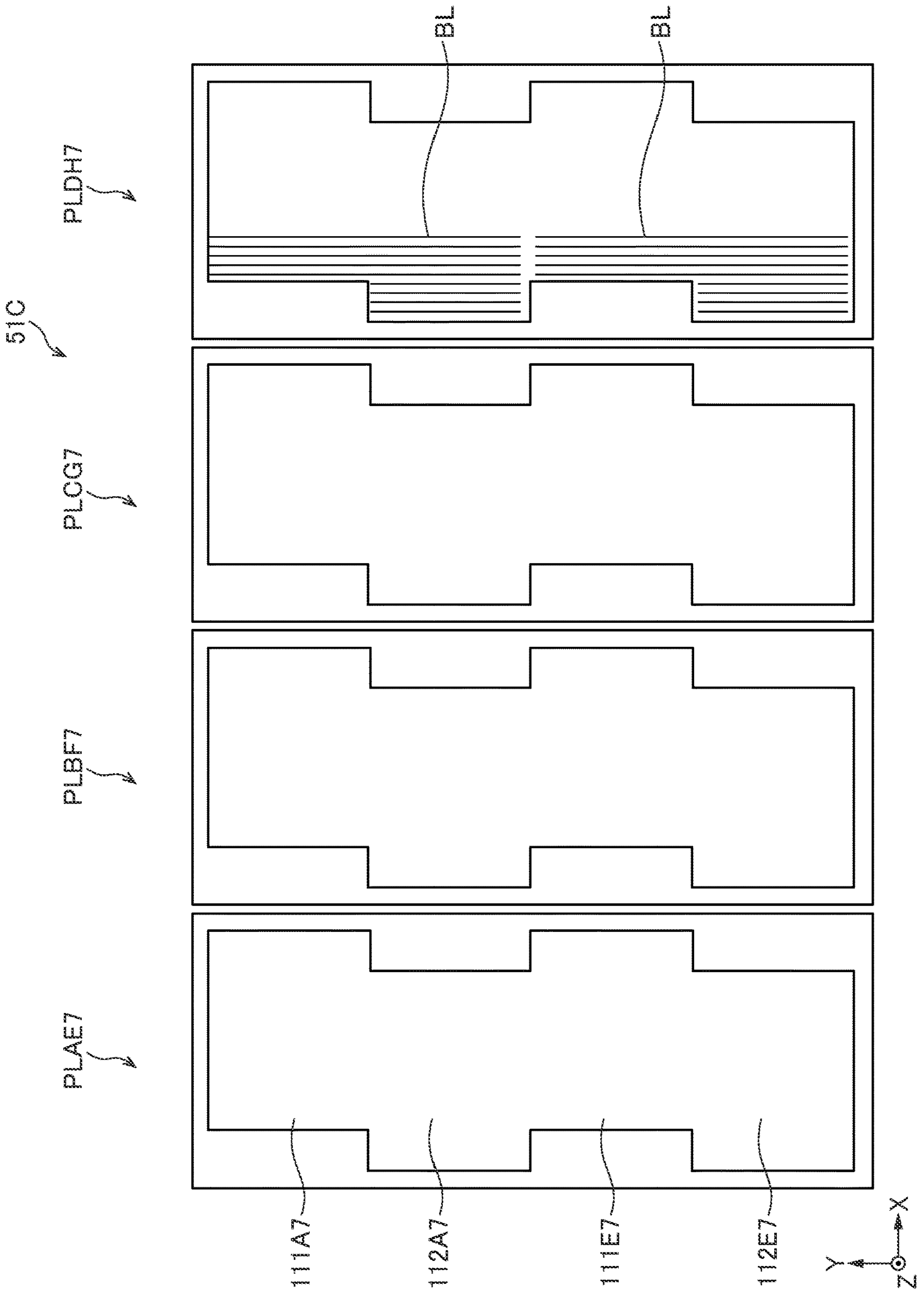
FIG. 8 is a diagram illustrating a disposition configuration on an array chip side of a semiconductor storage device according to a third modification example of the present embodiment.

A configuration is also possible in which the planes are coupled from the perspective of a reduction in chip size. FIG. 8 is a diagram for describing an array chip 51C according to a third modification example of the present embodiment. The array chip 51C is obtained by coupling planes of the array chip 51A described with reference to FIG. 6.

The array chip 51C includes four planes PLAE7, PLBF7, PLCG7, and PLDH7. The plane PLAE7 is obtained by coupling the plane PLA5 and the plane PLE5 of the array chip 51A. The plane PLAE7 includes memory cell arrays 111A7, 112A7, 111E7, and 112E7.

The memory cell array 111A7 corresponds to the memory cell array 111A included in the plane PLA5 of the array chip 51A. The memory cell array 112A7 corresponds to the memory cell array 112A included in the plane PLA5 of the array chip 51A. The memory cell arrays 111E7 and 112E7 correspond to the memory cell arrays included in the plane PLE5 of the array chip 51A.

No dummy staircases or no slits are formed between the memory cell array 111A7, the memory cell array 112A7, the memory cell array 111E7, and the memory cell array 112E7. The memory cell array 111A7, the memory cell array 112A7, the memory cell array 111E7, and the memory cell array 112E7 are joined. The memory cell array 111A7 and the memory cell array 112A7 share at least a group of the bit lines BL. The memory cell array 111E7 and the memory cell array 112E7 share at least a group of the bit lines BL.

Figure 9:
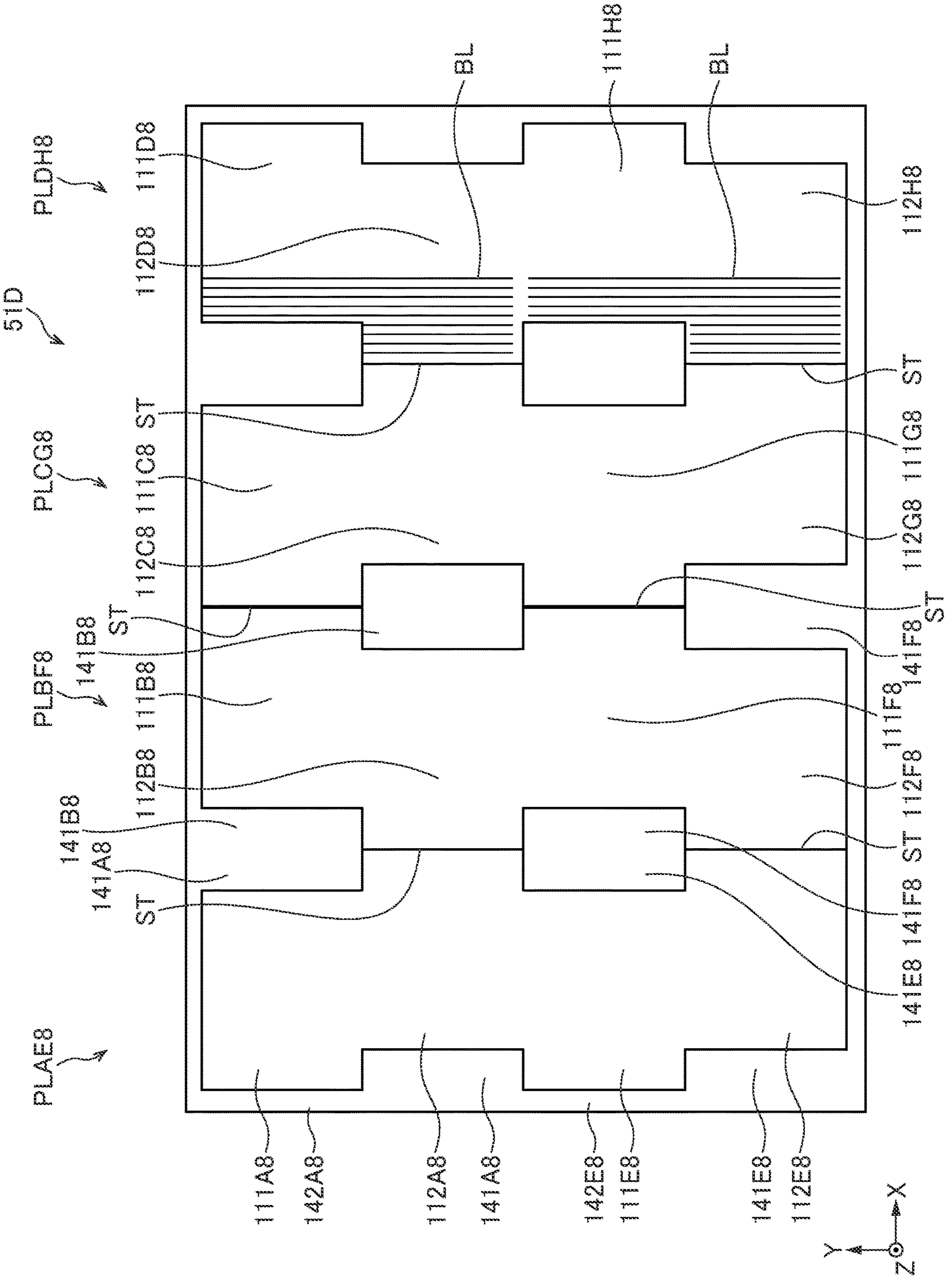
FIG. 9 is a diagram illustrating a disposition configuration on an array chip side of a semiconductor storage device according to a fourth modification example of the present embodiment.

A configuration is also possible in which the intervals between the planes in the X direction are shortened from the perspective of a further reduction in chip size. FIG. 9 is a diagram for describing an array chip 51D according to a fourth modification example of the present embodiment. The array chip 51D includes four planes PLAE8, PLBF8, PLCG8, and PLDH8.

As illustrated in FIG. 9, the planes PLAE8, PLBF8, PLCG8, and PLDH8 are disposed along the X direction.

The plane PLAE8 includes four memory cell arrays 111A8, 112A8, 111E8, and 112E8. The side of the memory cell array 111A8 in the −X direction is provided with a dummy staircase 142A8. The side of the memory cell array 111A8 in the +X direction is provided with a normal staircase 141A8. The side of the memory cell array 112A8 in the −X direction is provided with the normal staircase 141A8. The side of the memory cell array 112A8 in the +X direction is provided with a slit ST.

The side of the memory cell array 111E8 in the −X direction is provided with a dummy staircase 142E8. The side of the memory cell array 111E8 in the +X direction is provided with a normal staircase 141E8. The side of the memory cell array 112E8 in the −X direction is provided with the normal staircase 141E8. The side of the memory cell array 112E8 in the +X direction is provided with the slit ST.

The memory cell array 111A8 and the memory cell array 111E8 are disposed at the same positions with respect to the X direction. The memory cell array 112A8 and the memory cell array 112E8 are disposed at the same positions with respect to the X direction. The disposition positions of the memory cell array 112A8 and the memory cell array 112E8 are shifted from the disposition positions of the memory cell array 111A8 and the memory cell array 111E8 in the +X direction.

No dummy staircases or no slits are formed between the memory cell array 111A8, the memory cell array 112A8, the memory cell array 111E8, and the memory cell array 112E8. The memory cell array 111A8, the memory cell array 112A8, the memory cell array 111E8, and the memory cell array 112E8 are joined. The memory cell array 111A8 and the memory cell array 112A8 share at least a group of the bit lines BL. The memory cell array 111E8 and the memory cell array 112E8 share at least a group of the bit lines BL.

The plane PLBF8 includes four memory cell arrays 111B8, 112B8, 111F8, and 112F8. The side of the memory cell array 111B8 in the −X direction is provided with a normal staircase 141B8. The side of the memory cell array 111B8 in the +X direction is provided with the slit ST. The side of the memory cell array 112B8 in the −X direction is provided with the slit ST. The side of the memory cell array 112B8 in the +X direction is provided with the normal staircase 141B8.

The side of the memory cell array 111F8 in the −X direction is provided with a normal staircase 141F8. The side of the memory cell array 111F8 in the +X direction is provided with the slit ST. The side of the memory cell array 112F8 in the −X direction is provided with the slit ST. The side of the memory cell array 112F8 in the +X direction is provided with the normal staircase 141F8.

The memory cell array 111B8 and the memory cell array 111F8 are disposed at the same positions with respect to the X direction. The memory cell array 112B8 and the memory cell array 112F8 are disposed at the same positions with respect to the X direction. The disposition positions of the memory cell array 112B8 and the memory cell array 112F8 are shifted from the disposition positions of the memory cell array 111B8 and the memory cell array 111F8 in the −X direction.

The slit ST is provided between the memory cell array 112A8 of the plane PLAE8 and the memory cell array 112B8 of the plane PLBF8, but no staircase section is provided. The memory cell array 112A8 and the memory cell array 112B8 are thus disposed closer to each other than when a staircase section is provided.

The slit ST is provided between the memory cell array 112E8 of the plane PLAE8 and the memory cell array 112F8 of the plane PLBF8, but no staircase section is provided. The memory cell array 112E8 and the memory cell array 112F8 are thus disposed closer to each other than when a staircase section is provided.

No dummy staircases or no slits are formed between the memory cell array 111B8, the memory cell array 112B8, the memory cell array 111F8, and the memory cell array 112F8. The memory cell array 111B8, the memory cell array 112B8, the memory cell array 111F8, and the memory cell array 112F8 are joined. The memory cell array 111B8 and the memory cell array 112B8 share at least a group of the bit lines BL. The memory cell array 111F8 and the memory cell array 112F8 share at least a group of the bit lines BL.

The plane PLCG8 includes four memory cell arrays 111C8, 112C8, 111G8, and 112G8. The disposition configuration of the memory cell arrays 111C8, 112C8, 111G8, and 112G8 in the plane PLCG8 is similar to the disposition configuration of the memory cell arrays 111A8, 112A8, 111E8, and 112E8 in the plane PLAE8.

The slit ST is provided between the memory cell array 111C8 of the plane PLCG8 and the memory cell array 111B8 of the plane PLBF8, but no staircase section is provided. The memory cell array 111C8 and the memory cell array 111B8 are thus disposed closer to each other than when a staircase section is provided.

The slit ST is provided between the memory cell array 111G8 of the plane PLCG8 and the memory cell array 111F8 of the plane PLBF8, but no staircase section is provided. The memory cell array 111G8 and the memory cell array 111F8 are thus disposed closer to each other than when a staircase section is provided.

The plane PLDH8 includes four memory cell arrays 111D8, 112D8, 111H8, and 112H8. The disposition configuration of the memory cell arrays 111D8, 112D8, 111H8, and 112H8 in the plane PLDH8 is similar to the disposition configuration of the memory cell arrays 111B8, 112B8, 111F8, and 112F8 in the plane PLBF8.

Figure 10:
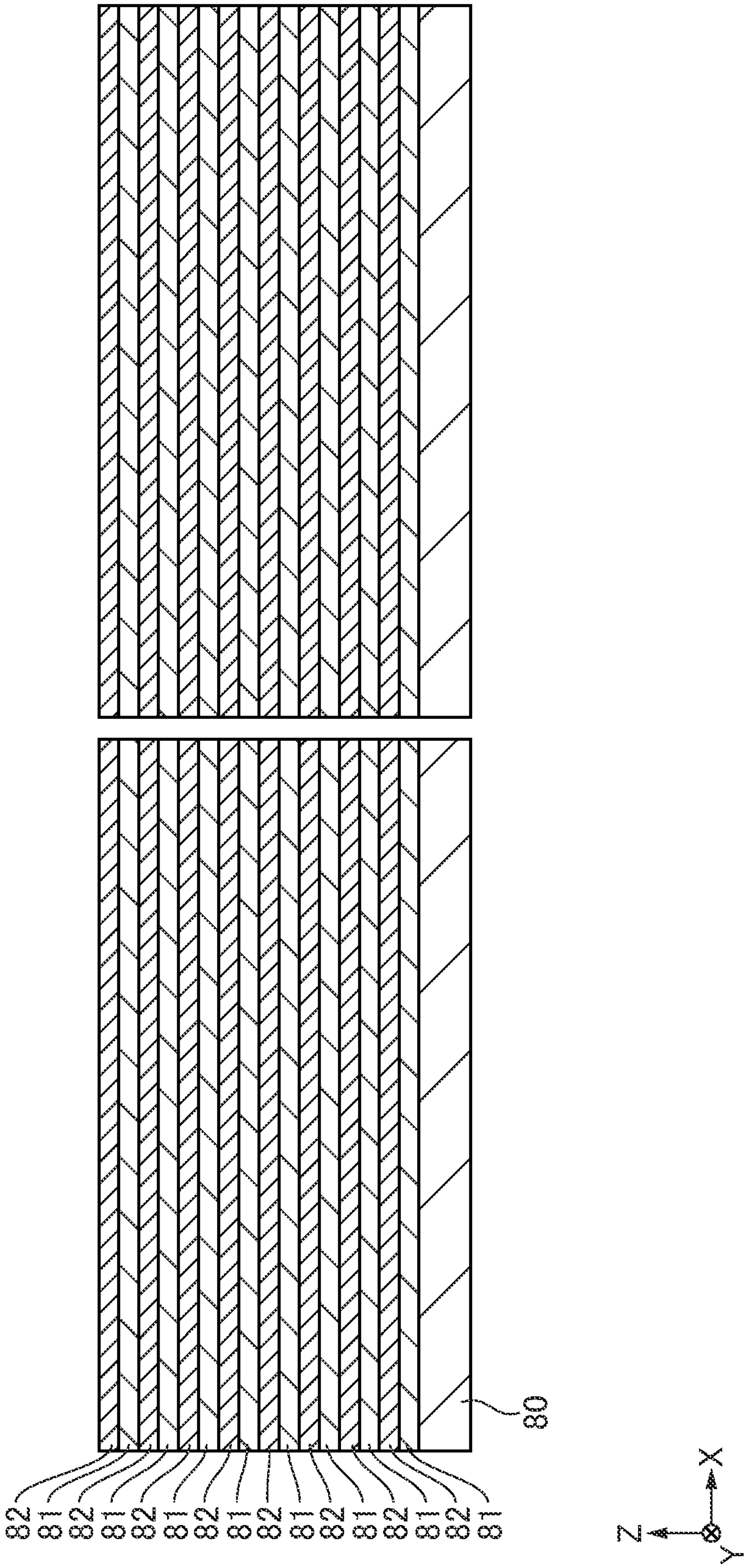
FIG. 10 is a diagram for describing a method of manufacturing an array chip of the semiconductor storage device according to the present embodiment.
Figure 11:
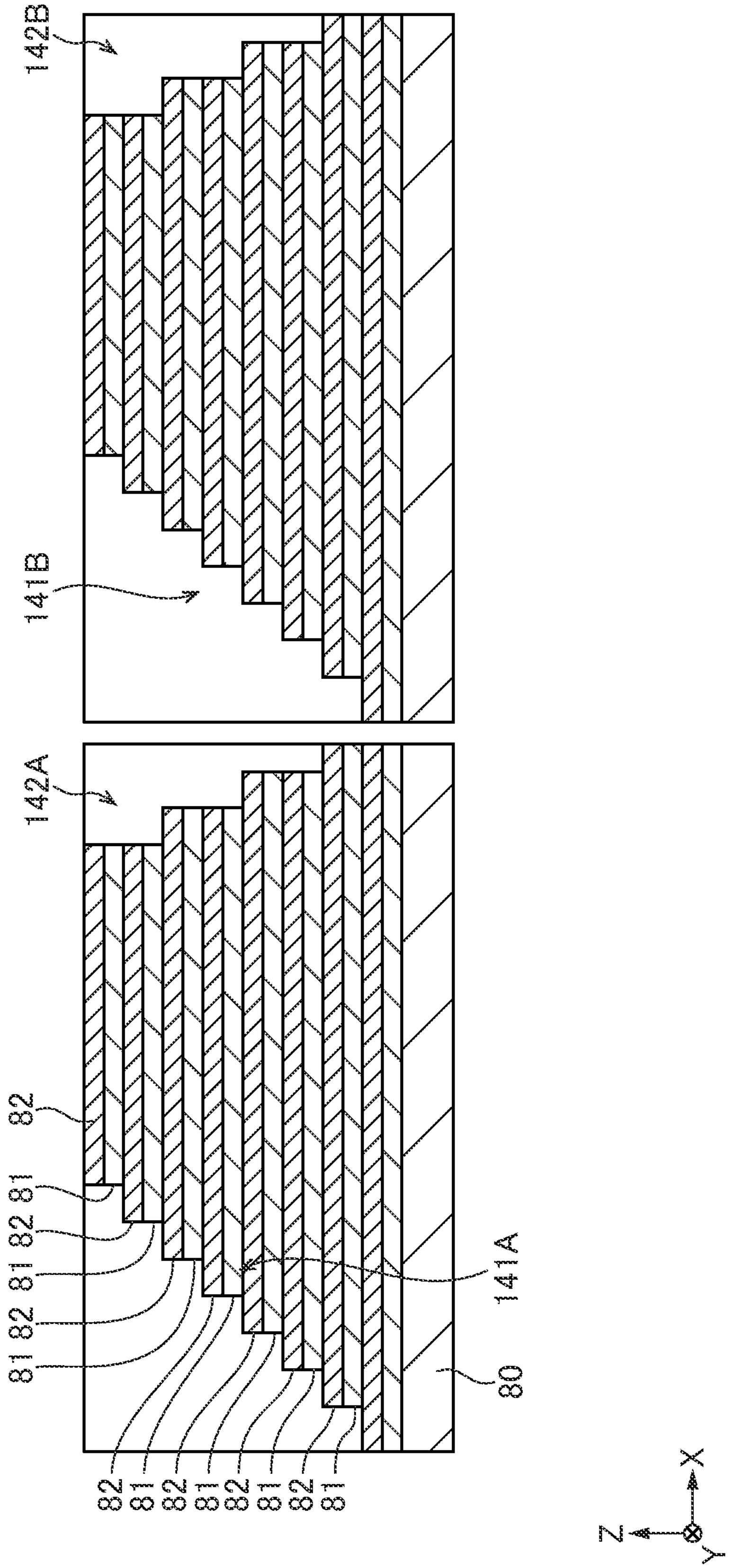
FIG. 11 is a diagram for describing the method of manufacturing the array chip of the semiconductor storage device according to the present embodiment.
Figure 12:
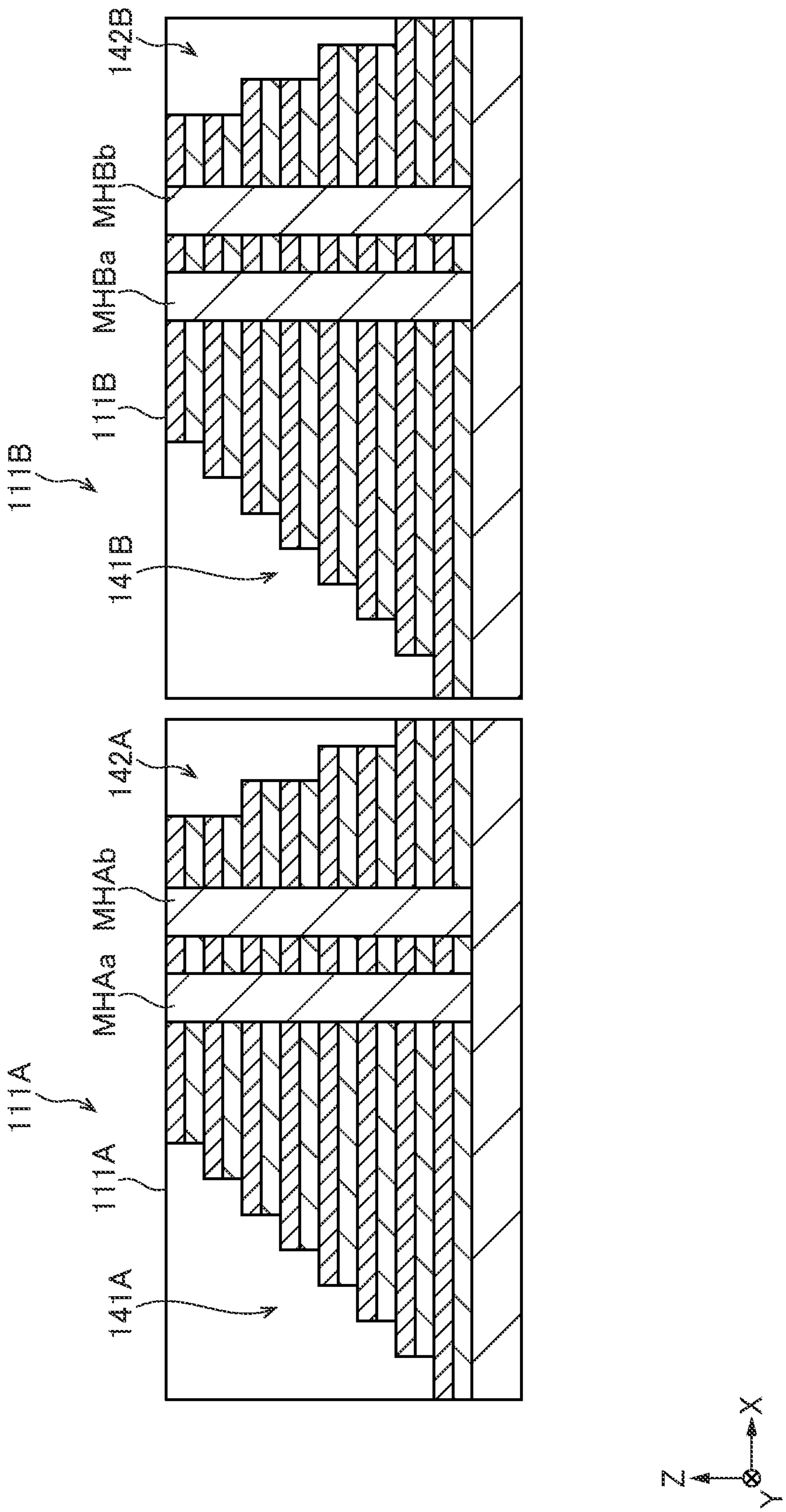
FIG. 12 is a diagram for describing the method of manufacturing the array chip of the semiconductor storage device according to the present embodiment.

Subsequently, a process of manufacturing the array chip 51 will be described with reference to FIGS. 10, 11, and 12. A description is given while illustrating the planes PLA and PLB of the array chip 51 described with reference to FIG. 4. The description is given while illustrating portions corresponding to the memory cell arrays 111A and 111B of the planes PLA and PLB.

Stacking Step

First, a stacking step is performed. In the stacking step, insulator layers 81 and sacrificial layers 82 are first stacked alternately to cover the surface of a substrate 80 in the Z direction. Each of the sacrificial layers 82 is a layer that is to be replaced with an electric conductor layer in a later step. The sacrificial layer 82 is a layer including, for example, nitrogen and silicon. FIG. 10 illustrates that the stacking step has been completed.

Staircase Formation Step

After the stacking step, a staircase formation step is performed. In the staircase formation step, for example, anisotropic etching and etching mask sliming are repeated to form the normal staircases 141A and 141B and the dummy staircases 142A and 142B in portions of the stacked insulator layers 81 and sacrificial layers 82. FIG. 11 illustrates that the normal staircases 141A and 141B and the dummy staircases 142A and 142B have been just formed in this way.

Hole Formation Step

After the staircase formation step, a hole formation step is performed. In the hole formation step, memory holes MHAa, MHAb, MHBa, and MHBb are formed in portions corresponding to memory pillars. All of these memory holes MHAa, MHAb, MHBa, and MHBb are substantially cylinder-shaped holes that are long and narrow and each has the longitudinal direction along the Z direction. The memory holes MHAa, MHAb, MHBa, and MHBb are formed, for example, by RIE (Reactive-ion Etching). After that, the inside of each of the memory holes MHAa, MHAb, MHBa, and MHBb is filled with a sacrificial filler. It is possible to use, for example, polysilicon, amorphous silicon, or the like for a material of the sacrificial filler. FIG. 12 illustrates that the hole formation step has been completed.

Sacrificial Filler Removal Step

After the hole formation step, a sacrificial filler removal step is performed. In the sacrificial filler removal step, the sacrificial fillers with which the memory holes MHAa, MHAb, MHBa, and MHBb are filled are removed. When polysilicon, amorphous silicon, or the like is used for the sacrificial fillers, it is possible to remove these sacrificial fillers, for example, by wet etching.

Memory Pillar Forming Step

After the sacrificial filler removal step, a memory pillar forming step (a forming step of memory pillars or the like) is performed. In the memory pillar or the like forming step, memory pillars are formed inside the memory holes MHAa, MHAb, MHBa, and MHBb. These memory pillars are all formed, for example, by chemical vapor deposition (CVD).

Replacement Step

After the memory pillar forming step, a replacement step is performed. In the replacement step, the sacrificial layers 82 are removed by wet etching. The respective stacked insulator layers 81 then remain with a gap in between. The respective insulator layers 81 are, however, supported by the memory pillars. The shape of each insulator layer 81 is thus maintained. After that, an electric conductor layer is formed, for example, by CVD in each of the gaps in which the sacrificial layers 82 used to be present.

Subsequently, a process of manufacturing the array chip 51D will be described with reference to FIGS. 13, 14, 15, and 16. A description is given while referring to the planes PLAE8 and PLBF8 of the array chip 51D described with reference to FIG. 9. The description is given while referring to portions corresponding to the memory cell arrays 112A8 and 112B8 with the slit ST formed between the plane PLAE8 and the plane PLBF8.

Stacking Step

Figure 13:
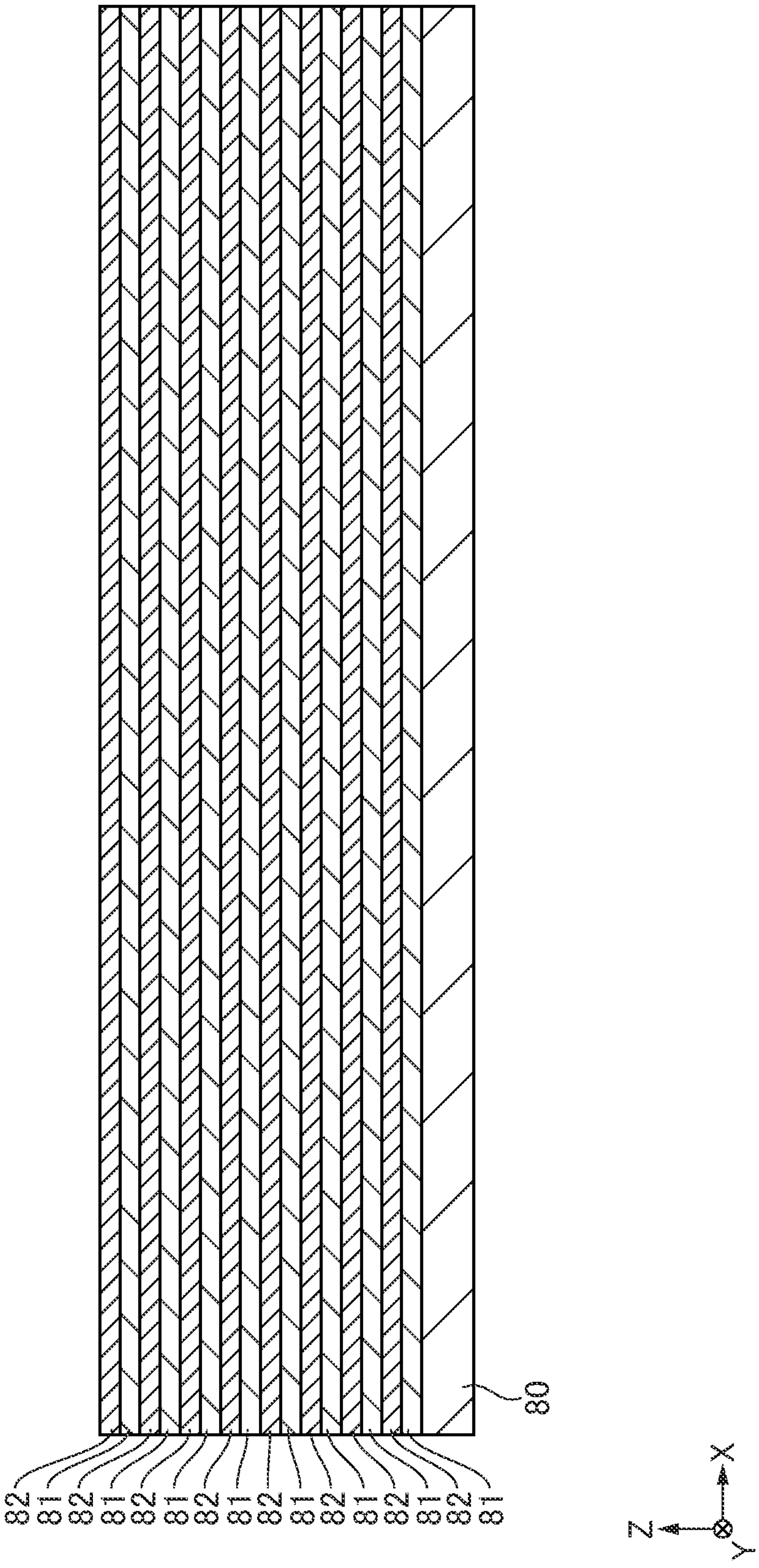
FIG. 13 is a diagram for describing the method of manufacturing the array chip of the semiconductor storage device according to the present embodiment.

First, a stacking step is performed. In the stacking step, the insulator layers 81 and the sacrificial layers 82 are first stacked alternately to cover the surface of the substrate 80 in the Z direction. Each of the sacrificial layers 82 is a layer that is to be replaced with an electric conductor layer in a later step. The sacrificial layer 82 is a layer including, for example, nitrogen and silicon. FIG. 13 illustrates that the stacking step has been completed.

Staircase Formation Step

Figure 14:
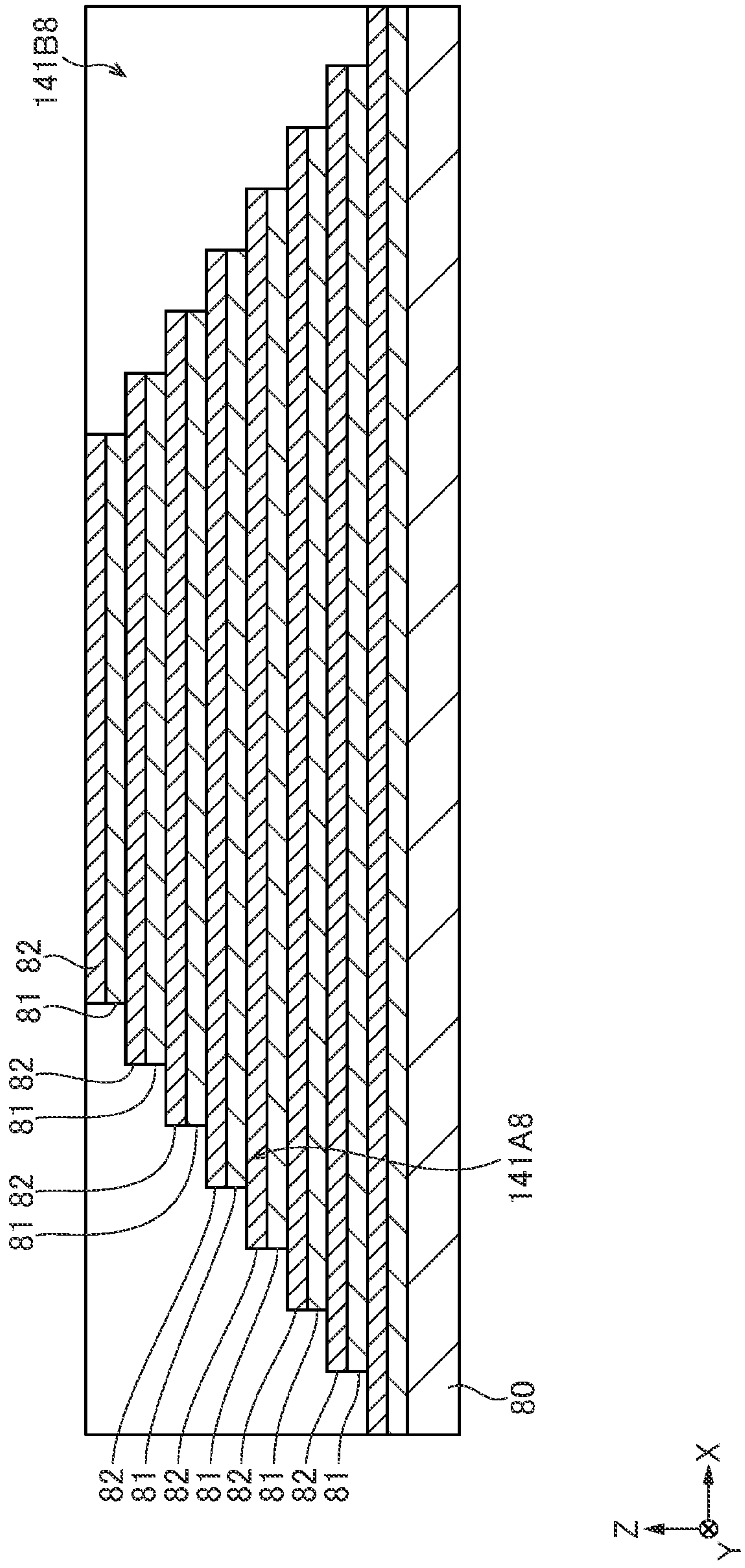
FIG. 14 is a diagram for describing the method of manufacturing the array chip of the semiconductor storage device according to the present embodiment.

After the stacking step, a staircase formation step is performed. In the staircase formation step, for example, anisotropic etching and etching mask sliming are repeated to form the normal staircases 141A8 and 141B8 in portions of the stacked insulator layers 81 and sacrificial layers 82. FIG. 14 illustrates that the normal staircases 141A8 and 141B8 have been just formed in this way.

Hole Formation Step

Figure 15:
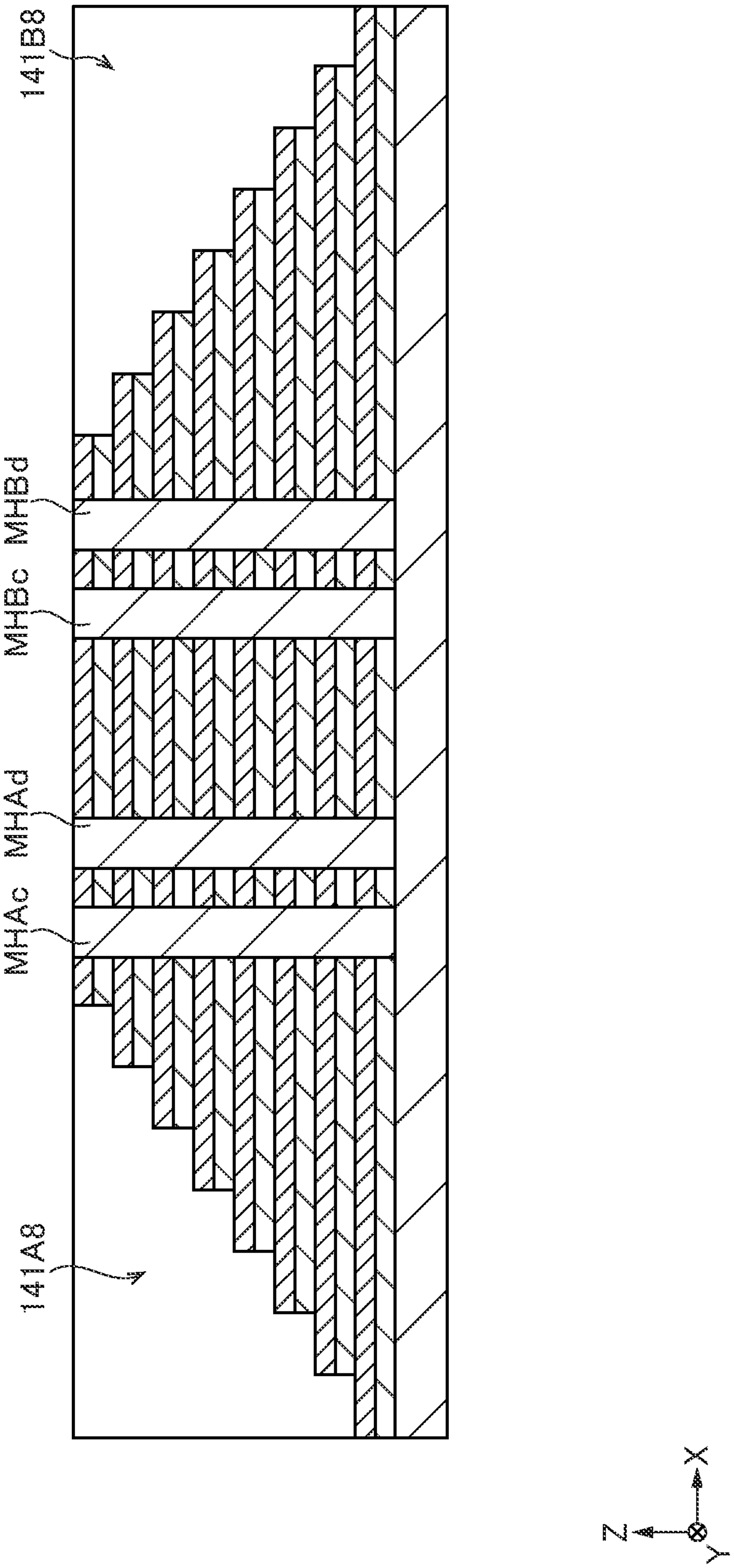
FIG. 15 is a diagram for describing the method of manufacturing the array chip of the semiconductor storage device according to the present embodiment.

After the staircase formation step, a hole formation step is performed. In the hole formation step, memory holes MHAc, MHAd, MHBc, and MHBd are formed in portions corresponding to memory pillars. All of these memory holes MHAc, MHAd, MHBc, and MHBd are substantially cylinder-shaped holes that are long and narrow and each has the longitudinal direction along the Z direction. The memory holes MHAc, MHAd, MHBc, and MHBd are formed, for example, by RIE. After that, the inside of each of the memory holes MHAc, MHAd, MHBc, and MHBd is filled with a sacrificial filler. It is possible to use, for example, polysilicon, amorphous silicon, or the like for a material of the sacrificial filler. FIG. 15 illustrates that the hole formation step has been completed.

Slit Formation Step

Figure 16:
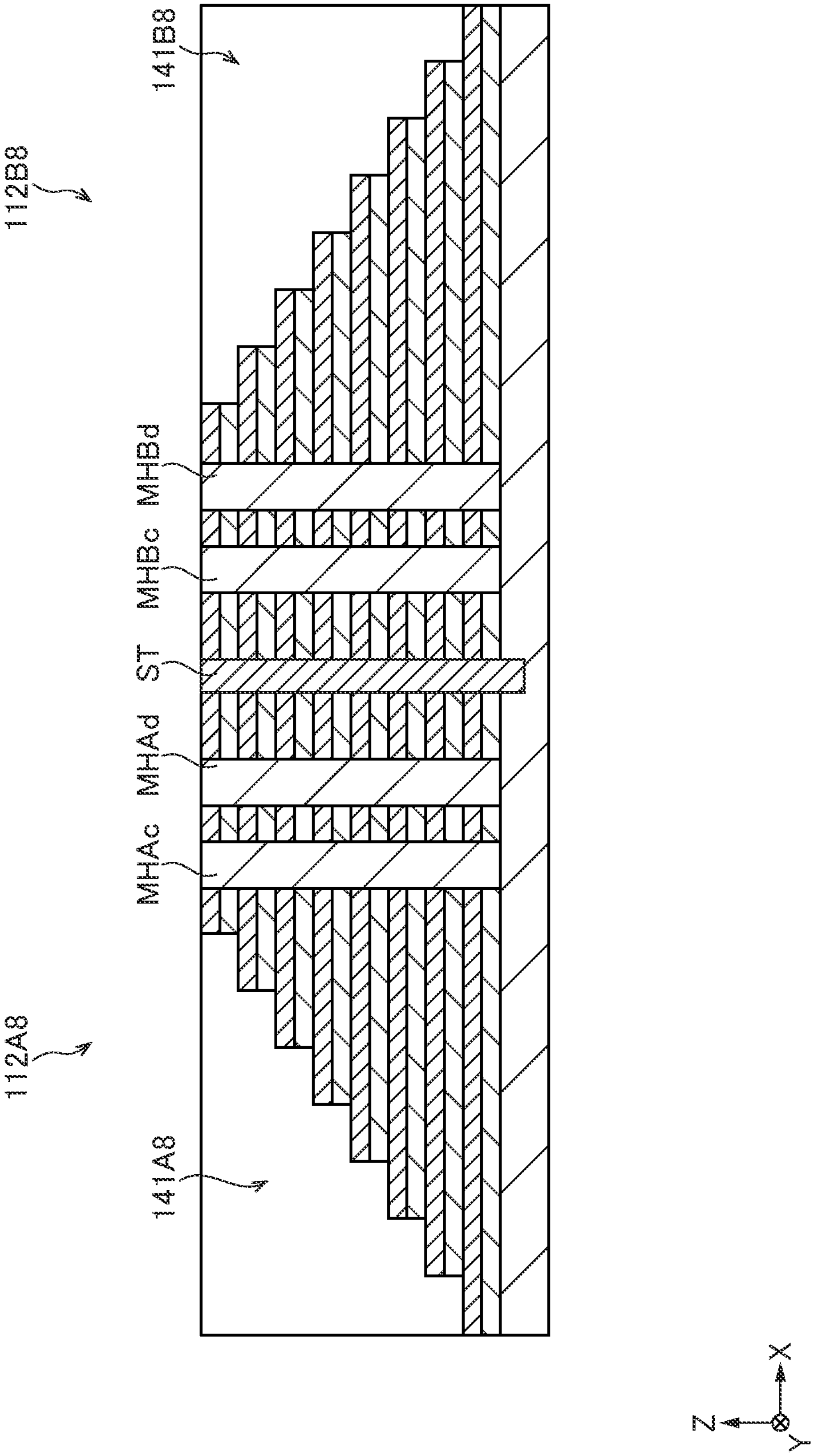
FIG. 16 is a diagram for describing the method of manufacturing the array chip of the semiconductor storage device according to the present embodiment.

After the hole formation step, a slit formation step is performed. The slit ST is formed between the memory holes MHAc and MHAd and the memory holes MHBc and MHBd. It is possible to use, for example, an insulating material including oxygen and silicon for a material of the slit ST. FIG. 16 illustrates that the slit formation step has been completed.

Sacrificial Filler Removal Step

After the slit formation step, a sacrificial filler removal step is performed. In the sacrificial filler removal step, the sacrificial fillers with which the memory holes MHAc, MHAd, MHBc, and MHBd are filled are removed. When polysilicon, amorphous silicon, or the like is used for the sacrificial fillers, it is possible to remove these sacrificial fillers, for example, by wet etching.

Memory Pillar Forming Step

After the sacrificial filler removal step, a memory pillar forming step (a forming step of memory pillars or the like) is performed. In the memory pillar or the like forming step, memory pillars are formed inside the memory holes MHAc, MHAd, MHBc, and MHBd. These memory pillars are all formed, for example, by CVD.

Replacement Step

After the memory pillar forming step, a replacement step is performed. In the replacement step, the sacrificial layers 82 are removed by wet etching. The respective stacked insulator layers 81 then remain with a gap in between. The respective insulator layers 81 are, however, supported by the memory pillars. The shape of each insulator layer 81 is thus maintained. After that, an electric conductor layer is formed, for example, by CVD in each of the gaps in which the sacrificial layers 82 used to be present.

The present embodiment has been described above with reference to the specific examples. The present disclosure is not, however, limited to these specific examples. Some design changes made by those skilled in the art as appropriate in these specific examples are also included in the scope of the present disclosure as long as the features of the present disclosure are included. The respective elements included in the specific examples, the disposition, conditions, and shapes of the elements, and the like are not limited to the exemplified elements, disposition, conditions, shapes, and the like. It is possible to make a change as appropriate. It is possible to appropriately use the respective elements included in the specific examples in different combinations as long as technical inconsistency is avoided.

What is claimed is:

1. A semiconductor storage device comprising:
- a stacked body in which a plurality of electrically conductive layers are stacked with an insulating layer interposed in between; and
- a circuit section that is provided to overlap with the stacked body in a stack direction, wherein:
- the stacked body includes a memory section in which a plurality of memory cells are disposed and a staircase section in which ends of the plurality of electrically conductive layers are stepped,
- the circuit section includes row decoders that are electrically connected to the plurality of electrically conductive layers,
- the staircase section includes a first structure and a second structure different from the first structure,
- the row decoders are provided to overlap with the staircase section in the stack direction,
- the second structure has a greater step gap than a step gap of the first structure,
- the memory section includes a first memory section and a second memory section,
- the staircase section includes a first staircase section and a second staircase section, the first staircase section being joined to the first memory section and including the first structure, and the second staircase section being joined to the second memory section and including the first structure,
- the row decoders include a first row decoder and a second row decoder, the first row decoder being joined to the first staircase section, and the second row decoder being joined to the second staircase section,
- the first row decoder is provided to overlap with a first side of the memory section and the second row decoder is provided to overlap with a second side of the memory section, the second side being different from the first side,
- a third staircase section is provided on the second side, the third staircase section being joined to the first memory section and including the second structure, and
- a fourth staircase section is provided on the first side, the fourth staircase section being joined to the second memory section and including the second structure.

2. The semiconductor storage device according to claim 1, wherein;
- a fifth staircase section is provided on a third side that joins the first side and the second side, the fifth staircase section being joined to the first memory section and including the second structure, and
- a sixth staircase section is provided on a fourth side that is different from the third side and joins the first side and the second side, the sixth staircase section being joined to the second memory section and including the second structure.

3. The semiconductor storage device according to claim 2, wherein the first structure is provided with a contact plug that is electrically joined to each of the row decoders.

4. The semiconductor storage device according to claim 3, wherein the memory cells include drains.

5. The semiconductor storage device according to claim 4, wherein the first memory section and the second memory section share a bit line that is joined to the drains.

6. The semiconductor storage device according to claim 5, wherein the bit line is bent between the first memory section and the second memory section.

7. The semiconductor storage device according to claim 5, wherein:

a seventh staircase section is provided between the first memory section and the second memory section, the seventh staircase section being joined to the first memory section and including the second structure, and an eighth staircase section is provided between the first memory section and the second memory section, the eighth staircase section being joined to the second memory section and including the second structure.

8. The semiconductor storage device according to claim 5, wherein an electrically conductive layer of the first memory section and an electrically conductive layer of the second memory section are joined.

9. The semiconductor storage device according to claim 1, wherein a plurality of the memory sections are provided, the plurality of memory sections being separated by a slit.

* * * * *